United States Patent
Iwasaki

(10) Patent No.: US 6,172,526 B1
(45) Date of Patent: Jan. 9, 2001

(54) INPUT/OUTPUT INTERFACE INCLUDING AN OUTPUT BUFFER CIRCUIT AND DEPLETION TYPE FIELD EFFECT TRANSISTOR

(75) Inventor: Tadashi Iwasaki, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/173,698

(22) Filed: Oct. 16, 1998

(30) Foreign Application Priority Data

Oct. 20, 1997 (JP) ................................... 9-286413

(51) Int. Cl.⁷ .............................................. H03K 19/0175
(52) U.S. Cl. .............................. 326/83; 326/72; 326/101
(58) Field of Search ................................ 326/101, 72, 80, 326/81, 83, 82

(56) References Cited

U.S. PATENT DOCUMENTS 5,270,589 * 12/1993 Sawada et al. ....................... 307/475

FOREIGN PATENT DOCUMENTS 4-243321   8/1992   (JP).

\* cited by examiner

*Primary Examiner*—Michael Tokar
*Assistant Examiner*—Anh Tran
(74) *Attorney, Agent, or Firm*—Young & Thompson

(57) ABSTRACT

A semiconductor interface circuit connected between a first semiconductor device driven by a first level power voltage and a second semiconductor device driven by a second level power voltage which is higher than the first level power voltage. The semiconductor interface circuit includes an output buffer circuit being connected to the first semiconductor device; and at least a depletion type field effect transistor connected between the output buffer circuit and the second semiconductor device, wherein the at least depletion type field effect transistor has a driving capability substantially equal to or near a driving capability of the output buffer circuit.

29 Claims, 9 Drawing Sheets

Gate width of depletion MOS field effect transistor

INPUT/OUTPUT INTERFACE INCLUDING AN OUTPUT BUFFER CIRCUIT AND DEPLETION TYPE FIELD EFFECT TRANSISTOR

BACKGROUND OF THE INVENTION

The present invention relates to an output buffer circuit for semiconductor integrated circuits, and an output buffer enabling an input/output interface between semiconductor integrated circuits operated by different power voltages.

As the degree of integration of the semiconductor integrated circuits has been on the increase and high speed performances have also been improved, the required power has also been increased. In order to reduce the power voltage level, it is possible that two or more semiconductor integrated circuits are provided in a single wafer, wherein the semiconductor integrated circuits axe driven or operated by different power voltage levels. It is here assumed that the first semiconductor integrated circuit is operated or driven by the low power voltage, whilst the second semiconductor integrated circuit is operated or driven by the high power voltage. If the first and second semiconductor integrated circuits are directly connected to each other, then a leakage of current at a few milliamperes may flow through an input buffer circuit of the second semiconductor integrated circuit during when signals transmitted between the first and second semiconductor integrated circuit are in the high level. This problem is serious particularly with large scale integrated circuits including high power voltage semiconductor integrated circuits, each of which has more than several tend to input terminals through which leakage of currents flow, resulting in a remarkable increase in power consumption.

In Japanese laid-open patent publication No. 4-243321, it is disclosed to settle the above problem with the increased power consumption, wherein an output buffer circuit as an interface circuit is disposed between first and second semiconductor integrated circuits driven by different power voltage levels.

In Japanese laid-open patent publication No. 6-291638, it is disclosed to reduce a leakage of current flowing through a direct connection between the low power voltage semiconductor integrated circuit and the high power voltage semiconductor integrated circuit.

The conventional interface circuit is disposed between the first and second semiconductor integrated circuits driven by the low and high power voltages respectively. This conventional interface circuit comprises an output buffer circuit and an n-channel depletion MOS field effect transistor connected in series between an output node of the output buffer and an input/output pad of the second semiconductor integrated circuit driven by the high power voltage level. The n-channel depletion MOS field effect transistor is formed in a p-well region. The output buffer circuit comprises a complementary MOS circuit which comprises a series connection of n-channel and p-channel enhancement type MOS field effect transistors. If a low voltage signal level is outputted from the input/output pad, then the output node side source electrode of the n-channel depletion MOS field effect transistor becomes the ground level so that the output node side source electrode of the n-channel depletion MOS field effect transistor becomes equal to the voltage of the p-well in which the n-channel depletion MOS field effect transistor is formed. If a high voltage signal level is outputted from the input/output pad, then the p-channel enhancement MOS field effect transistor turns ON so that the output node side source electrode of the n-channel depletion MOS field effect transistor becomes the high level or the power voltage level. However the voltage of the p-well region, in which the n-channel depletion MOS field effect transistor is formed, is fixed at the lowest voltage level or the ground level, for which reason the p-well region is applied with a back bias, whereby a threshold voltage of the depletion type n-channel MOS field effect transistor is raised, resulting in a remarkable deterioration in driving capability of the depletion type n-channel MOS field effect transistor.

In order to solve the above problem with the remarkable deterioration in driving capability of the depletion type n-channel MOS field effect transistor when the high voltage level is outputted from the input/output pad 5, it was proposed to increase the gate width of the depletion type n-channel MOS field effect transistor to attempt to increase the current driving capability. Since, however, the current driving capability depends upon the series connection of the driver transistor in the buffer circuit and the depletion type n-channel MOS field effect transistor, variations in the current driving capability are as illustrated in FIG. 1. If the driving capability of the depletion type n-channel MOS field effect transistor becomes much larger than the driving capability of the driver transistor in the buffer circuit, then the current driving capability is influenced mainly by the characteristic Or the driving capability of the driver transistor of the buffer circuit. For this reason, even if the gate width of the depletion type n-channel MOS field effect transistor is remarkably increased thereby the layout area thereof is also remarkably increased, a small increase in driving capability is obtained. This means that the degree of the integration of the circuits is deteriorated. Also even if the driving capability of the driver transistor in the buffer circuit becomes much larger than the depletion type n-channel MOS field effect transistor, then the current driving capability is influenced mainly by the characteristic or the driving capability of the depletion type n-channel MOS field effect transistor. For this reason, even if the gate width of the driver transistor in the buffer circuit is remarkably increased thereby the layout area thereof is also remarkably increased, a small increase in driving capability is obtained. This means that the degree of the integration of the circuits is deteriorated.

In the above circumstances, it had been required to optimize a driving capability of a depletion type MOS field effect transistor provided between an output node of a buffer circuit connected with the low power voltage semiconductor integrated circuit and an input/output pad of the high power voltage semiconductor integrated circuit.

SUMMARY OF THE INVENTION

Accordingly, it is an object of the present invention to provide a novel depletion type MOS field effect transistor possessing an optimized driving capability, which is provided between an output node of a buffer circuit connected with the low power voltage semiconductor integrated circuit and an input/output pad of the high power voltage semiconductor integrated circuit, free from the above problems.

It is a further object of the present invention to provide a novel depletion type MOS field effect transistor permitting an increased degree of integration of circuits, wherein the depletion type MOS field effect transistor is provided between an output node of a buffer circuit connected with the low power voltage semiconductor integrated circuit and an input/output pad of the high power voltage semiconductor integrated circuit.

It is a still further object of the present invention to provide a novel method of optimizing a driving capability of a depletion type MOS field effect transistor possessing an optimized driving capability, which is provided between an output node of a buffer circuit connected with the low power voltage semiconductor integrated circuit and an input/output pad of the high power voltage semiconductor integrated circuit.

The present invention provides a semiconductor interface circuit connected between a first semiconductor device driven by a first level power voltage and a second semiconductor device driven by a second level power voltage which is higher than the first level power voltage. The semiconductor interface circuit comprises an output buffer circuit being connected to the first semiconductor device; and at least a depletion type field effect transistor connected between the output buffer circuit and the second semiconductor device, wherein the at least depletion type field effect transistor has a driving capability substantially equal to or near a driving capability of the output buffer circuit.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
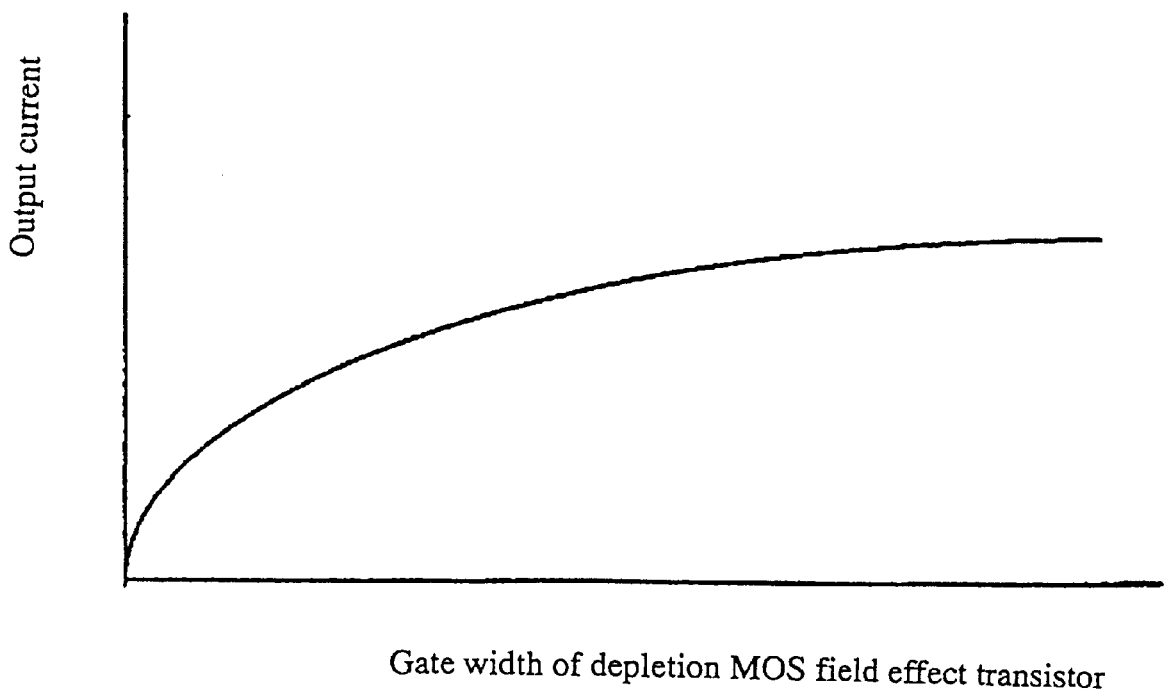
FIG. 1 is a diagram illustrative of variations in output current from a depletion type field effect transistor over a gate width of the depletion type field effect transistor.

The first embodiment of the present invention provides a semiconductor interface circuit connected between a first semiconductor device driven by a first level power voltage and a second semiconductor device driven by a second level power voltage which is higher than the first level power voltage. The semiconductor interface circuit comprises an output buffer circuit being connected to the first semiconductor device; and at least one depletion type field effect transistor connected between the output buffer circuit and the second semiconductor device, wherein the at least one depletion type field effect transistor has a driving capability substantially equal to or near a driving capability of the output buffer circuit.

It is preferable that a difference in driving capability between the at least one depletion type field effect transistor and the output buffer circuit is within 10% of a range of variation in driving capability on manufacturing of the at least depletion type field effect transistor and the output buffer circuit.

It is also preferable that the at least one depletion type field effect transistor has such a transistor size defined by a product of a channel length and a channel width thereof as to maximize a driving current efficiency defined to be a quotient obtained by dividing a driving current flowing between the at least one depletion type field effect transistor and the second semiconductor device by a layout area of both the output buffer circuit and the at least one depletion type field effect transistor.

It is also preferable that the at least one depletion type field effect transistor has a gate electrode applied with the same voltage level as applied to the output buffer circuit.

It is also preferable that the output buffer circuit composes at least a driver transistor, and the driving capability of the at least depletion type field effect transistor is substantially the same as a driving capability of the at least driver transistor in the output buffer circuit.

It is also preferable that a difference in driving capability between the at least depletion type field effect transistor and the at least driver transistor in the output buffer circuit is within 10% of a range of variation in driving capability on manufacturing of the at least depletion type field effect transistor and the at least driver transistor.

It is further preferable that the at least depletion type field effect transistor has such a transistor size defined by a product of a channel length and a channel width thereof as to maximize a quotient defined by dividing a driving current flowing between the at least depletion type field effect transistor and the second semiconductor device by a layout area of both the at least driver transistor and the at least depletion type field effect transistor.

It is further preferable that the output buffer circuit comprises a complementary MOS circuit which further comprises a series connection of first and second enhancement type MOS field effect transistors of first and second conductivity types serving as driver transistors between a power voltage line and a ground line, and wherein the at least depletion type field effect transistor comprises a single depletion type field effect transistor connected in series between an output node of the complementary MOS circuit and an input/output pad of the second semiconductor device, and the single depletion type field effect transistor has a gate electrode connected to the power voltage line.

It is further more preferable that a first node between the output node of the CMOS circuit and the single depletion type field effect transistor is connected to an input side of an input inventor gate having an output connected to the first semiconductor device.

It is further preferable that the output buffer circuit comprises a complementary MOS circuit which further comprises a series connection of first and second enhancement type MOS field effect transistors of first and second conductivity types serving as driver transistors between a power voltage line and a ground line, and wherein the at least depletion type field effect transistor comprises: a first depletion type field effect transistor connected in series between an output node of the complementary MOS circuit and an input/output pad of the second semiconductor device; and a second depletion type field effect transistor connected in series between the input/output pad of the second semiconductor device and an input side of an input inventor gate having an output connected to the first semiconductor device, and the second depletion type field effect transistor has a gate electrode connected to the power voltage line.

It is also preferable that the output buffer circuit is provided within a first rectangular region defined by a common width and a first length, and the at least depletion type field effect transistor is provided within a second rectangular region defined by the common width and a second length, and the first and second rectangular regions are aligned in a length direction to form a semiconductor interface circuit rectangular-shaped cell unit defined by a standardized size of the common width and a sum of the first and second lengths.

It is also preferable that the output buffer circuit comprises a complementary MOS circuit which further comprises a series connection of first and second enhancement type MOS field effect transistors of first and second conductivity types serving as driver transistors between a power voltage line and a ground line, wherein the at least depletion type field effect transistor comprises a single depletion type field effect transistor connected in series between an output node of the complementary MOS circuit and an input/output pad of the second semiconductor device, and the single depletion type field effect transistor has a gate electrode connected to the power voltage line, wherein the first enhancement type MOS field effect transistor is provided within a first rectangular region defined by a common width and a first length, wherein the second enhancement type MOS field effect transistor is provided within a second rectangular region defined by a common width and a second length, and wherein the single depletion type field effect transistor is provided within a third rectangular region defined by the common width and a third length, so that the first, second and third rectangular region are aligned in a length direction to form a semiconductor interface circuit rectangular-shaped cell unit defined by a standardized size of the common width and a sum of the first, second and third lengths.

It is also preferable that the output buffer circuit comprises a complementary MOS circuit which further comprises a series connection of first and second enhancement type MOS field effect transistors of first and second conductivity types serving as driver transistors between a power voltage line and a ground line, and wherein the at least depletion type field effect transistor comprises: a first depletion type field effect transistor connected in series between an output node of the complementary MOS circuit and an input/output pad of the second semiconductor device; and a second depletion type field effect transistor connected in series between the input/output pad of the second semiconductor device and an input side of an input inventor gate having an output connected to the first semiconductor device, and the second depletion type field effect transistor has a gate electrode connected to the power voltage line, and wherein the first enhancement type MOS field effect transistor is provided within a first rectangular region defined by a common width and a first length, wherein the second enhancement type MOS field effect transistor is provided within a second rectangular region defined by a common width and a second length, and wherein the first and second depletion type field effect transistors are provided within a third rectangular region defined by the common width and a third length, so that the first, second and third rectangular region are aligned in a length direction to form a semiconductor interface circuit rectangular-shaped cell unit defined by a standardized size of the common width and a sum of the first, second and third lengths.

It is also preferable that the first and second semiconductor devices comprise first and second semiconductor integrated circuits.

The second embodiment of the present invention provides a semiconductor interface circuit connected between a first semiconductor integrated circuit driven by a first level power voltage and a second semiconductor integrated circuit driven by a second level power voltage which is higher than the first level power voltage. The semiconductor interface circuit comprises: an output buffer circuit having an input side being connected to the first semiconductor integrated circuit; and at least a depletion type field effect transistor connected between an output side of the output buffer circuit and an input/output terminal of the second semiconductor integrated circuit, wherein the at least depletion type field effect transistor has such a transistor size defined by a product of a channel length and a channel width thereof as to provide the at least depletion type field effect transistor with a driving capability substantially equal to or near a driving capability of the output buffer circuit.

It is preferable that a difference in driving capability between the at least depletion type field effect transistor and the output buffer circuit is within 10% of a range of variation in driving capability on manufacturing of the at least depletion type field effect transistor and the output buffer circuit.

It is also preferable that the transistor size of the at least depletion type field effect transistor is decided to maximize a driving current efficiency defined to be a quotient obtained by dividing a driving current flowing between the at least depletion type field effect transistor and the second semiconductor integrated circuit by a layout area of both the output buffer circuit and the at least depletion type field effect transistor It is also preferable that the at least depletion type field effect transistor has a gate electrode applied with the same voltage level as applied to the output buffer circuit.

It is also preferable that the output buffer circuit comprises at least a driver transistor, and the driving capability of the at least depletion type field effect transistor is substantially the same as a driving capability of the at least driver transistor in the output buffer circuit It is further preferable that a difference in driving capability between the at least depletion type field effect transistor and the at least driver transistor in the output buffer circuit is within 10% of a range of variation in driving capability on manufacturing of the at least depletion type field effect transistor and the at least driver transistor.

It is further preferable that the transistor size of the at least depletion type field effect transistor is decided to maximize a quotient defined by dividing a driving current flowing between the at least depletion type field effect transistor and the second semiconductor integrated circuit by a layout area of both the at least driver transistor and the at least depletion type field effect transistor.

It is further preferable that the output buffer circuit comprises a complementary MOS circuit which further comprises a series connection of first and second enhancement type MOS field effect transistors of first and second conductivity types serving as driver transistors between a power voltage line and a ground line, and wherein the at least depletion type field effect transistor comprises a single depletion type field effect transistor connected in series between an output node of the complementary MOS circuit and an input/output pad of the second semiconductor integrated circuit, and the single depletion type field effect transistor has a gate electrode connected to the power voltage line.

It is further preferable that a first node between the output node of the CMOS circuit and the single depletion type field effect transistor is connected to an input side of an input inventor gate having an output connected to the first semiconductor integrated circuit.

It is further preferable that the output buffer circuit comprises a complementary MOS circuit which further comprises a series connection of first and second enhancement type MOS field effect transistors of first and second conductivity types serving as driver transistors between a power voltage line and a ground line, and wherein the at least depletion type field effect transistor comprises: a first depletion type field effect transistor connected in series between an output node of the complementary MOS circuit and an input/output pad of the second semiconductor integrated circuit; and a second depletion type field effect transistor connected in series between the input/output pad of the second semiconductor integrated circuit and an input side of an input inventor gate having an output connected to the first semiconductor integrated circuit, and the second depletion type field effect transistor has a gate electrode connected to the power voltage line.

It is further preferable that the output buffer circuit is provided within a first rectangular region defined by a common width and a first length, and the at least depletion type field effect transistor is provided within a second rectangular region defined by the common width and a second length, and the first and second rectangular regions are aligned in a length direction to form a semiconductor interface circuit rectangular-shaped cell unit defined by a standardized size of the common width and a sum of the first and second lengths.

It is further preferable that the output buffer circuit comprises a complementary MOS circuit which further comprises a series connection of first and second enhancement type MOS field effect transistors of first and second conductivity types serving as driver transistors between a power voltage line and a ground line, wherein the at least depletion type field effect transistor comprises a single depletion type field effect transistor connected in series between an output node of the complementary MOS circuit and an input/output pad of the second semiconductor integrated circuit, and the single depletion type field effect transistor has a gate electrode connected to the power voltage line, wherein the first enhancement type MOS field effect transistor is provided within a first rectangular region defined by a common width and a first length, wherein the second enhancement type MOS field effect transistor is provided within a second rectangular region defined by a common width and a second length, and wherein the single depletion type field effect transistor is provided within a third rectangular region defined by the common width and a third length, so that the first, second and third rectangular region are aligned in a length direction to form a semiconductor interface circuit rectangular-shaped cell unit defined by a standardized size of the common width and a sum of the first, second and third lengths.

It is also preferable that the output buffer circuit comprises a complementary MOS circuit which further comprises a series connection of first and second enhancement type MOS field effect transistors of first and second conductivity type serving as driver transistors between a power voltage line and a ground line, and wherein the at least depletion type field effect transistor comprises: a first depletion type field effect transistor connected in series between an output node of the complementary MOS circuit and an input/output pad of the second semiconductor integrated circuit; and a second depletion type field effect transistor connected in series between the input/output pad of the second semiconductor integrated circuit and an input side of an input inventor gate having an output connected to the first semiconductor integrated circuit, and the second depletion type field effect transistor has a gate electrode connected to the power voltage line, and wherein the first enhancement type MOS field effect transistor is provided within a first rectangular region defined by a common width and a first length wherein the second enhancement type MOS field effect transistor is provided within a second rectangular region defined by a common width and a second length, and wherein the first and second depletion type field effect transistors are provided within a third rectangular region defined by the common width and a third length, so that the first, second and third rectangular region are aligned in a length direction to form a semiconductor interface circuit rectangular-shaped cell unit defined by a standardized size of the common width and a sum of the first, second and third lengths.

The third embodiment of the present invention provides a semiconductor interface circuit connected between a first semconductor integrated circuit driven by a first level power voltage and a second semiconductor integrated circuit driven by a second level power voltage which is higher than the first level power voltage. The semiconductor interface circuit comprises: an output buffer circuit comprising a complementary MOS circuit which further comprises a series connection of first and second enhancement type MOS field effect transistors of first and second conductivity types serving as driver transistors, the complementary MOS circuit being connected between a power voltage line and a ground line, and the complementary MOS circuit having an input side being connected to the first semiconductor integrated circuit and an output terminal; and a single depletion type field effect transistor connected in series between an output node of the complementary MOS circuit and an input/output pad of the second semiconductor integrated circuit, and the single depletion type field effect transistor has a gate electrode connected to the power voltage line, wherein the single depletion type field effect transistor has such a transistor size defined by a product of a channel length and a channel width thereof as to provide the single depletion type field effect transistor with substantially the same driving capability as the complementary MOS circuit, and wherein the transistor size of the single depletion type field effect transistor and transistor sizes of the fist and second enhancement type MOS field effect transistors in the output buffer circuit are decided to maximize a driving current efficiency defined to be a quotient obtained by dividing a driving current flowing through the input/output pad by a layout area of both the output buffer circuit and the single depletion type field effect transistor.

It is also preferable that a difference in driving capability between the single depletion type field effect transistor and the output buffer circuit is within 10% of a range of variation in driving capability on manufacturing of the single depletion type field effect transistor and the output buffer circuit.

It is also preferable that the first enhancement type MOS field effect transistor is provided within a first rectangular region defined by a common width and a first length, wherein the second enhancement type MOS field effect transistor is provided within a second rectangular region defined by a common width and a second length, and wherein the single depletion type field effect transistor is provided within a third rectangular region defined by the common width and a third length, so that the first, second and third rectangular region are aligned in a length direction to form a semiconductor interface circuit rectangular-shaped cell unit defined by a standardized size of the common width and a sum of the first, second and third lengths.

The fourth embodiment of the present invention provides a semiconductor interface circuit connected between a first semiconductor integrated circuit driven by a first level power voltage and a second semiconductor integrated circuit driven by a second level power voltage which is higher than the first level power voltage. The semiconductor interface circuit comprises: an output buffer circuit comprising a complementary MOS circuit which further comprises a series connection of first and second enhancement type MOS field effect transistors of first and second conductivity types serving as driver transistors, the complementary MOS circuit being connected between a power voltage line and a ground line, and the complementary MOS circuit having an input side being connected to the first semiconductor integrated circuit and an output terminal; a first depletion type field effect transistor connected in series between an output node of the complementary MOS circuit and an input/output pad of the second semiconductor integrated circuit; and a second depletion type field effect transistor connected in series between the input/output pad of the second semiconductor integrated circuit and an input side of an input inventor gate having an output connected to the first semiconductor integrated circuit, and the second depletion type field effect transistor has a gate electrode connected to the power voltage line, wherein the first and second depletion type field effect transistors have first and second transistor sizes, each of which is defined by a product of a channel length and a channel width thereof so that the fist and second transistor sizes are so decided as to provide the first and second depletion type field effect transistors with substantially the same driving capability as the complementary MOS circuit, and wherein the first and second transistor size of the first and second depletion type field effect transistors and transistor sizes of the first and second enhancement type MOS field effect transistors in the output buffer circuit are decided to maximize a driving current efficiency defined to be a quotient obtained by dividing a driving cent flowing through the input/output pad by a layout area of both the output buffer circuit and the first and second depletion type field effect transistors.

It is preferable that a difference in driving capability between the first and second depletion type field effect transistors and the output buffer circuit is within 10% of a range of variation in driving capability on manufacturing of the first and second depletion type field effect transistors and the output buffer circuit.

It is also preferable that the first enhancement type MOS field effect transistor is provided within a first rectangular region defined by a common width and a first length, wherein the second enhancement type MOS field effect transistor is provided within a second rectangular region defined by a common width and a second length, and wherein the first and second depletion type field effect transistors are provided within a third rectangular region defined by the common width and a third length, so that the first, second and third rectangular region are aligned in a length direction to form a semiconductor interface circuit rectangular-shaped cell unit defined by a standardized size of the common width and a sum of the first, second and third lengths.

The fifth embodiment of the present invention provides a method of optimizing a layout size of a semiconductor interface circuit connected between a first semiconductor device driven by a first level power voltage and a second semiconductor device driven by a second level power voltage which is higher than the first level power voltage. The semiconductor interface circuit comprises: an output buffer circuit being connected to the first semiconductor device; and at least a depletion type field effect transistor being connected between the output buffer circuit and the second semiconductor device. The method comprises the steps of: setting a driving capability of the output buffer circuit as well as setting a common width and a first length to define a first rectangular region of the common width and the first length, so that the buffer circuit is provided on the first rectangular region; setting a transistor size of the at least depletion type field effect transistor, as well as setting a second length to define a second rectangular region of the common width and the second length, so that the at least depletion type field effect transistor is provided on the second rectangular region, whereby the first and second rectangular regions are aligned in a length direction to form a semiconductor interface circuit rectangular-shaped cell unit defined by a standardized size of the common width and a sum of the first and second lengths; calculating a driving current flowing between the at least depletion type field effect transistor and the second semiconductor device, in order to make a first verification that a driving current efficiency is a maximum value, which is defined by dividing the driving current by a layout area of both the output buffer circuit and the at least depletion type field effect transistor; if the first verification could not be obtained, varying the transistor size of the at least depletion type field effect transistor provided that the driving capability of the at least depletion type field effect transistor is substantially equal to or near the driving capability of the output buffer circuit for subsequent returning to the calculation step; and repeating the foregoing steps until the first verification could be obtained.

It is also preferable to further make a second verification that the driving capability of the output buffer circuit satisfies a predetermined requirement; if the second verification could not be obtained, varying the driving capability of the output buffer circuit for subsequent returning to the transistor size setting step; and repeating the foregoing steps until the second verification could be obtained.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting the common width; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the firm rectangular region and the second rectangular region.

It is also preferable that the buffer circuit comprises a complementary MOS circuit which furthered comprises a first enhancement MOS field effect transistor of a first conductivity type and a second enhancement MOS field effect transistor of a second conductivity type, wherein the first step comprises: setting the common width; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a slam of the first and second-half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region. It is also preferable that the buffer circuit comprises a complementary MOS circuit which further comprises a first enhancement MOS field effect transistor of a fist conductivity type and a second enhancement MOS field effect transistor of a second conductivity type. The first step comprises: setting a first driving capability of the first enhancement MOS field effect transistor to find a first-half length of the first length to define a first-half rectangular region of the common width and the first-half length in the first rectangular region, so that the fast enhancement MOS field effect transistor is provided on the first-half rectangular region; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting the common width The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region and are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first stop comprises: setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting the common width. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular regions and the second rectangular region are aligned in the length direction to form the semiconductor interface circuit rectangular-shaped cell unit defined by a standardized size of the common width and a sum of the first and second half lengths and the second length The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region.

The sixth embodiment of the present invention provides a method of optimizing a layout size of a semiconductor interface circuit connected between a first semiconductor device driven by a first level power voltage and a second semiconductor device driven by a second level power voltage which is higher than the first level power voltage, the semiconductor interface circuit comprising: an output buffer circuit being connected to the first semiconductor device; and at least a depletion type field effect transistor being connected between the output buffer circuit and the second semiconductor device. The method comprises the steps of: setting a driving capability of the output buffer circuit as well as setting a common width and a first length to define a first rectangular region of the common width and the first length, so that the buffer circuit is provided on the first rectangular region; setting a transistor size of the at least depletion type field effect transistor, as well as setting a second length to define a second rectangular region of the common width and the second length, so that the at least depletion type field effect transistor is provided on the second rectangular region, whereby the first and second rectangular regions are aligned in a length direction to form a semiconductor interface circuit rectangular-shaped cell unit defined by a standardized size of the common width and a sum of the first and second lengths; calculating a driving current flowing between the at least depletion type field effect transistor and the second semiconductor device, in order to make a first verification that a driving current efficiency is a maximum value, which is defined by dividing the driving current by a layout area of the first rectangular region; if the first verification could not be obtained, varying the transistor size of the at least depletion type field effect transistor provided that the driving capability of the at least depletion type field effect transistor is substantially equal to or near the driving capability of the output buffer circuit for subsequent returning to the calculation step; and repeating the foregoing steps until the fast verification could be obtained.

It is also preferable to further make a second verification that the driving capability of the output buffer circuit satisfies a predetermined requirement; if the second verification could not be obtained, varying the driving capability of the output buffer circuit for subsequent returning to the transistor size setting step; and repeating the foregoing steps until the second verification could be obtained.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting the common width; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region. The second step comprises; setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting the common width; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the first rectangular region, so that the first enhancement MOS field effect transistor is provided on the fist-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second-half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting the common width. The second step comprise: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region and are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the fist enhancement MOS field effect transistor to find a first-half length of the first length to define a first-half rectangular region of the common width and the first-half length in the first rectangular region, so that the first enhancement MOS field effect transistor is provided on the first-half rectangular region; and setting the common width. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular regions and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

The seventh embodiment of the present invention provides a circuit simulator for optimizing a layout size of a semiconductor interface circuit connected between a first semiconductor device driven by a first level power voltage and a second semiconductor device driven by a second level power voltage which is higher than the first level power voltage, the semiconductor interface circuit comprising: an output buffer circuit being connected to the first semiconductor device; and at least a depletion type field effect transistor being connected between the output buffer circuit and the second semiconductor device, wherein the circuit simulator performs processes comprising the steps of: setting a driving capability of the output buffer circuit as well as setting a common width and a first length to define a first rectangular region of the common width and the first length, so that the buffer circuit is provided on the first rectangular region; setting a transistor size of the at least depletion type field effect transistor, as well as setting a second length to define a second rectangular region of the common width and the second length, so that the at least depletion type field effect transistor is provided on the second rectangular region, whereby the first and second rectangular regions are aligned in a length direction to form a semiconductor interface circuit rectangular-shaped cell unit defined by a standardized size of the common width and a sum of the first and second lengths; calculating a driving current flowing between the at least depletion type field effect transistor and the second semiconductor device, in order to make a first verification that a driving current efficiency is a maximum value, which is defined by dividing the driving current by a total layout area of the first rectangular region and the second rectangular region; if the first verification could not be obtained, varying the transistor size of the at least depletion type field effect transistor provided that the driving capability of the at least depletion type field effect transistor is substantially equal to or near the driving capability of the output buffer circuit for subsequent returning to the calculation step; and repeating the foregoing steps until the first verification could be obtained.

It is preferable that the processes further includes a step of making a second verification that the driving capability of the output buffer circuit satisfies a predetermined requirement; if the second verification could not be obtained, varying the driving capability of the output buffer circuit for subsequent returning to the transistor size setting step; and repeating the foregoing steps until the second verification could be obtained.

It is also preferable that the buffer circuit comprises a complementary MOS circuit which further comprises a first enhancement MOS field effect transistor of a first conductivity type and a second enhancement MOS field effect transistor of a second conductivity type, and wherein the first step comprises: setting the common width; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to first a second-half length of the first length to define a second-half rectangular region of the common width and the second-half length in the first rectangular region, so that the second enhancement MOS field effect transistor is provided on the second-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the ring current by a total layout area of the first and second half regions of the first rectangular region and the second rectangular region.

It is also preferable that the buffer circuit comprises a complementary MOS circuit which further comprises a first enhancement MOS field effect transistor of a fast conductivity type and a second enhancement MOS field effect transistor of a second conductivity type, wherein the first step comprises: setting the common width; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the first rectangular region, so that the first enhancement MOS field effect transistor is provided on the fist-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second-half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region.

It is also preferable that the buffer circuit comprises a complementary MOS circuit which further comprises a first enhancement MOS field effect transistor of a fist conductivity type and a second enhancement MOS field effect transistor of a second conductivity type, wherein the first step comprises: setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; and setting the common width. The second step comprises: setting the transistor size of the at least depletion type field effect transistor; as well as setting the second length to define a second rectangular region of the common width and the second length, so that the at least depletion type field effect transistor is provided on the second rectangular region, whereby the first and second half regions of the first rectangular region and the second rectangular region and are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; and setting the common width. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular regions and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a dog current efficiency is a maximum value, which is defined by dividing the driving current by a total layout area of the first and second half regions of the first rectangular region and the second rectangular region.

The eighth embodiment of the present invention provides a circuit simulator for optimizing a layout size of a semiconductor interface circuit connected between a first semiconductor device driven by a first level power voltage and a second semiconductor device driven by a second level power voltage which is higher than the first level power voltage, the semiconductor interface circuit comprising: an output buffer circuit being connected to the first semiconductor device; and at least a depletion type field effect transistor being connected between the output buffer circuit and the second semiconductor device, wherein the circuit simulator performs processes comprising the steps of: setting a driving capability of the output buffer circuit as well as setting a common width and a first length to define a first rectangular legion of the common width and the first length, so that the buffer circuit is provided on the first rectangular region; setting a transistor size of the at least depletion type field effect transistor, as well as setting a second length to define a second rectangular region of the common width and the second length, so that the at least depletion type field effect transistor is provided on the second rectangular region, whereby the first and second rectangular regions are aligned in a length direction to form a semiconductor interface circuit rectangular-shaped cell unit defined by a standardized size of the common width and a sum of the first and second lengths; calculating a driving current flowing between the at least depletion type field effect transistor and the second semiconductor device, in order to make a first verification that a driving current efficiency is a maximum value, which is defined by dividing the driving current by a layout area of the first rectangular region; if the first verification could not be obtained, varying the transistor size of the at least depletion type field effect transistor provided that the driving capability of the at least depletion type field effect transistor is substantially equal to or near the driving capability of the output buffer circuit for subsequent returning to the calculation step; and repeating the foregoing steps until the first verification could be obtained.

It is also preferable that the processes further includes a step of making a second verification that the driving capability of the output buffer circuit satisfies a predetermined requirement; if the second verification could not be obtained, varying the driving capability of the output buffer circuit for subsequent returning to the transistor size setting step; and repeating the foregoing steps until the second verification could be obtained.

It is also preferable that the buffer circuit comprises a complementary MOS circuit which further composes a first enhancement MOS field effect transistor of a first conductivity type and a second enhancement MOS field effect transistor of a second conductivity type, and wherein the first step comprises: setting the common width; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the fist length to define a second-half rectangular region of the common width and the second-half length in the first rectangular region, so that the second enhancement MOS field effect transistor is provided on the second-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the fist rectangular region and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting the common width; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the first rectangular region, so that the first enhancement MOS field effect transistor is provided on the fit-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second-half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a first driving capability of the first enhancement MOS field effect traitor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the fist rectangular region, so that the second enhancement MOS field effect transistor is provided on the second-half rectangular region; and setting the common width. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region and are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting the common width. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular regions and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

The ninth embodiment of the present invention provides a storage medium storing a computer-readable program for optimizing a layout size of a semiconductor interface circuit connected between a first semiconductor device driven by a first level power voltage and a second semiconductor device driven by a second level power voltage which is higher than the first level power voltage, the semiconductor interface circuit comprising: an output buffer circuit being connected to the first semiconductor device; and at least a depletion type field effect transistor being connected between the output buffer circuit and the second semiconductor device, wherein the computer-readable program comprises the steps of: setting a driving capability of the output buffer circuit as well as setting a common width and a first length to define a first rectangular region of the common width and the first length, so that the buffer circuit is provided on the first rectangular region; setting a transistor size of the at least depletion type field effect transistor, as well as setting a second length to define a second rectangular region of the common width and the second length, so that the at least depletion type field effect transistor is provided on the second rectangular region, whereby the first and second rectangular regions are aligned in a length direction to form a semiconductor interface circuit rectangular-shaped cell unit defined by a standardized size of the common width and a sum of the first and second lengths; calculating a driving current flowing between the at least depletion type field effect transistor and the second semiconductor device, in order to make a first verification that a driving current efficiency is a maximum value, which is defined by dividing the driving current by a total layout area of the first rectangular region and the second rectangular region; if the first verification could not be obtained, varying the transistor size of the at least depletion type field effect transistor provided that the driving capability of the at least depletion type field effect transistor is substantially equal to or near the driving capability of the output buffer circuit for subsequent returning to the calculation step; and repeating the foregoing steps until the first verification could be obtained It is preferable that computer-readable program further includes a step of making a second verification that the driving capability of the output buffer circuit satisfies a predetermined requirement; if the second verification could not be obtained, varying the driving capability of the output buffer circuit for subsequent returning to the transistor size setting step; and repeating the foregoing steps until the second verification could be obtained.

It is also preferable that the buffer circuit comprises a complementary MOS circuit which further comprises a first enhancement MOS field effect transistor of a first conductivity type and a second enhancement MOS field effect transistor of a second conductivity type, and wherein the first step comprises: setting the common width; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the fast rectangular region, so that the second enhancement MOS field effect transistor is provided on the second-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a slum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting the common width; setting a second driving capability of the second enhancement MOS field effect transistor to find a second-half length of the fast length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to defined a first-half rectangular region of the common width and the first-half length in the first rectangular region, so that the first enhancement MOS field effect transistor is provided on the first-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second-half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting the common width. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the fist rectangular region, so that the first enhancement MOS field effect transistor is provided on the first-half rectangular region; and setting the common width. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular regions and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region and the second rectangular region.

The tenth embodiment of the present invention provides a storage medium storing a computer-readable program for optimizing a layout size of a semiconductor interface circuit connected between a first semiconductor device driven by a first level power voltage and a second semiconductor device driven by a second level power voltage which is higher than the first level power voltage The semiconductor interface circuit comprises: an output buffer circuit being connected to the first semiconductor device; and at least a depletion type field effect transistor being connected between the output buffer circuit and the second semiconductor device, wherein the computer-readable program comprises the steps of: setting a driving capability of the output buffer circuit as well as setting a common width and a first length to define a first rectangular region of the common width and the first length, so that the buffer circuit is provided on the first rectangular region; setting a transistor size of the at least depletion type field effect transistor, as well as setting a second length to define a second rectangular region of the common width and the second length, so that the at least depletion type field effect transistor is provided on the second rectangular region, whereby the first and second rectangular regions are aligned in a length direction to form a semiconductor interface circuit rectangular-shaped cell unit defined by a standardized size of the common width and a sum of the first and second lengths; calculating a driving current flowing between the at least depletion type field effect transistor and the second semiconductor device, in order to make a first verification that a driving current efficiency is a maximum value, which is defined by dividing the driving current by a layout area of the first rectangular region; if the first verification could not be obtained, varying the transistor size of the at least depletion type field effect transistor provided that the driving capability of the at least depletion type field effect transistor is substantially equal to or near the driving capability of the output buffer circuit for subsequent returning to the calculation step; and repeating the foregoing steps until the first verification could be obtained.

It is also preferable that the computer-readable program further includes a step of making a second verification that the driving capability of the output buffer circuit satisfies a predetermined requirement; if the second verification could not be obtained, varying the driving capability of the output buffer circuit for subsequent returning to the transistor size setting step; and repeating the foregoing steps until the second verification could be obtained It is also preferable that the buffer circuit comprises a complementary MOS circuit which further comprises a first enhancement MOS field effect transistor of a first conductivity type and a second enhancement MOS field effect transistor of a second conductivity type, and wherein the first step comprises: setting the common width; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the fist rectangular region and the second rectangular region are aligned in the length direction to form the semiconductor interface circuit rectangular-shaped cell unit defined by a standardized size of the common width and a sum of the first and second half lengths and the second length. The third stop comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting the common width; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region are aligned in the length direction to form the semiconductor interface circuit rectangular-shaped cell unit defined by a standardized size of the common width and a sum of the first and second-half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; and setting the common width. The second step comprises: setting the transistor size of the at least depletion type field effect transistor, as well as setting the second length to define a second rectangular region of the common width and the second length, so that the at least depletion type field effect transistor is provided on the second rectangular region, whereby the first and second half regions of the first rectangular region and the second rectangular region and are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

It is also preferable that the buffer circuit comprises a complementary MOS circuit which further comprises a first enhancement MOS field effect transistor of a first conductivity type and a second enhancement MOS field effect transistor of a second conductivity type, wherein the first step comprises: setting a second driving capability of the second enhancement MOS field effect transistor to find a second-half length of the first length to define a second-half rectangular region of the common width and the second-half length in the first rectangular region, so that the second enhancement MOS field effect transistor is provided on the second-half rectangular region; setting a first driving capability of the first enhancement MOS field effect transistor to find a first-half length of the first length to define a first-half rectangular region of the common width and the first-half length in the first rectangular region, so that the first enhancement MOS field effect transistor is provided on the first-half rectangular region; and setting the common width. The second step comprises: setting the transistor size of the at least depletion type field effect transistor, as well as setting the second length to define a second rectangular region of the common width and the second let, so that the at least depletion type field effect transistor is provided on the second rectangular region, whereby the first and second half regions of the first rectangular regions and the second rectangular region are aligned in the length direction to form the semiconductor interface circuit rectangular-shaped cell unit defined by a standardized size of the common width and a sum of the first and second half lengths and the second length. The third step comprises: calculating the driving current flowing between the at least depletion type field effect transistor and the second semiconductor device, in order to make a first verification that a driving current efficiency is a maximum value, which is defined by dividing the driving current by a total layout area of the first and second half regions of the first rectangular region.

PREFERRED EMBODIMENTS

First Embodiment

Figure 2:
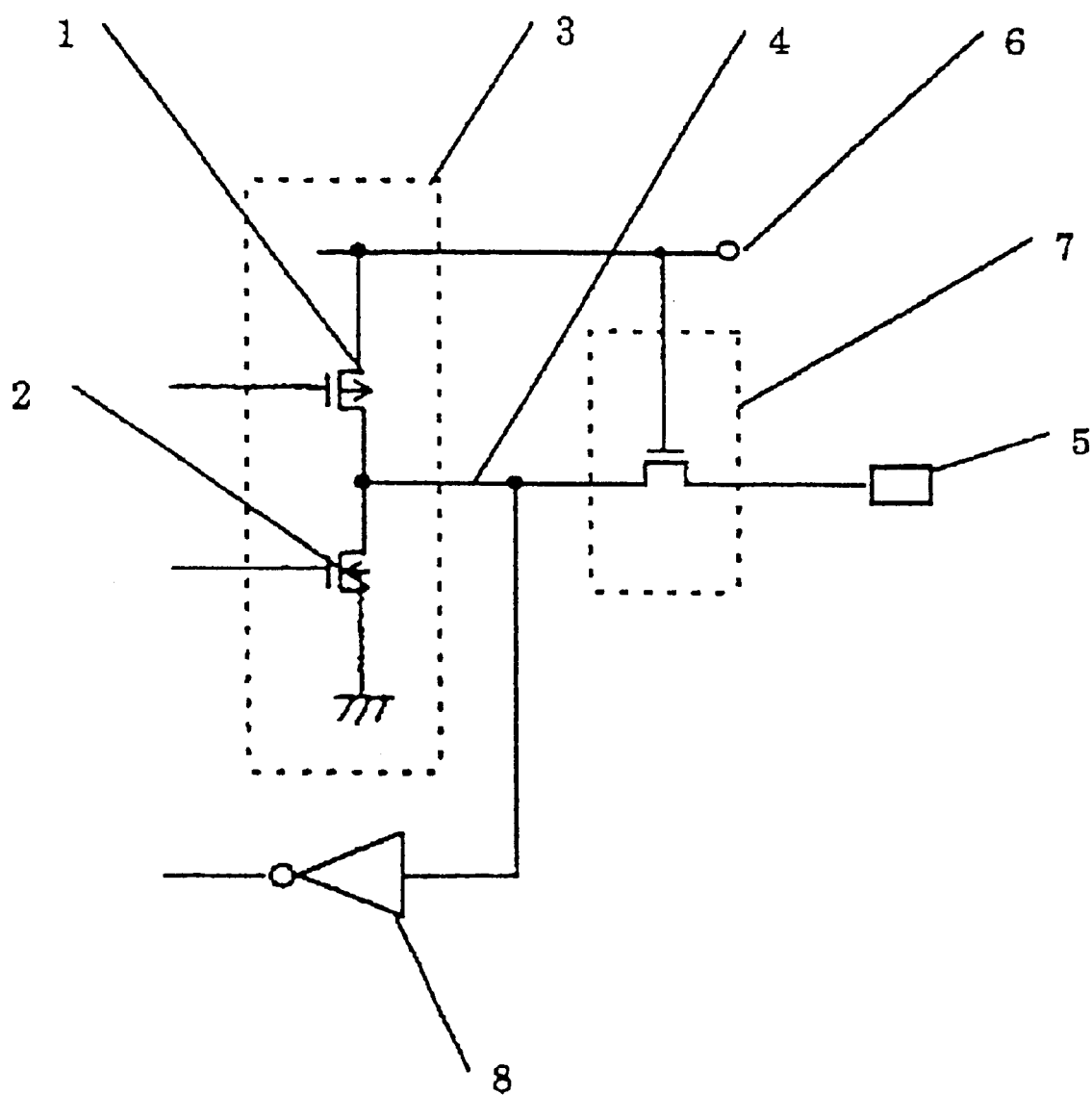
FIG. 2 which is a circuit diagram illustrative of a novel semiconductor interface circuit between two semiconductor integrated circuits driven by different power voltage levels in first and second embodiments in accordance with the present invention.

A first embodiment according to the present invention will be described in detail with reference to FIG. 2 which is a circuit diagram illustrative of a novel semiconductor interface circuit between two semiconductor integrated circuits driven by different power voltage levels. The novel semiconductor interface circuit is connected between a first semiconductor integrated circuit driven by a first power voltage level and a second semiconductor integrated circuit driven by a second power voltage level which is higher than the first power voltage level. Illustrations of the first and second semiconductor integrated circuits are omitted. The novel semiconductor interface circuit comprises an output buffer circuit 3 which is represented by a rectangular shaped frame of broken lines and a depletion type MOS field effect transistor 7 which is represented by a rectangular shaped frame of broken lines. The output buffer circuit 3 comprises a complementary MOS circuit having an input side connected to the first semiconductor integrated circuit and an output node 4 connected to the depletion type MOS field effect transistor 7. The depletion type MOS field effect transistor 7 is connected in series between the output node 4 of the complementary MOS circuit and an input/output pad 5 of the second semiconductor integrated circuit. The depletion type MOS field effect transistor 7 is an n-channel type. The complementary MOS circuit comprises a series connection of a p-channel enhancement type MOS field effect transistor 1 and an n-channel enhancement type MOS field effect transistor 2 between a power voltage line 6 and a ground line. The p-channel enhancement type MOS field effect transistor 1 and the n-channel enhancement type MOS field effect transistor 2 serve as first and second driver transistors. Gate electrodes of the p-channel enhancement type MOS field effect transistor 1 and the n-channel enhancement type MOS field effect transistor 2 are connected to the output side of the first semiconductor integrated circuit for receiving output signals from the first semiconductor integrated circuit. A gate electrode of the depletion type MOS field effect transistor 7 is also connected to the power voltage line 6. The output node 4 of the complementary MOS circuit is connected to an input side of an inventor gate 8 having an output side connected to the first semiconductor integrated circuit.

It is essential for the present invention that the depletion type MOS field effect transistor 7 is designed to have a driving capability which is substantially equal to or near a driving capability of the output buffer circuit 3. For example, a difference in driving capability between the depletion type MOS field effect transistor 7 and the output buffer circuit 3 is within 10% of a range of variation in driving capability on manufacturing of the depletion type MOS field effect transistor and the output buffer circuit. When the driving capability of the depletion type MOS field effect transistor 7 is substantially equal to or near the driving capability of the output buffer circuit 3, it is possible to maximize a driving current efficiency defined to be a quotient obtained by dividing a driving current flowing through the input/output pad 5 by a total layout area of both the output buffer circuit 3 and the depletion type MOS field effect transistor 7 or by a layout area of the output buffer circuit 3. This maximization of the driving current efficiency of the semiconductor interface circuit allows an increase in degree of integration of the semiconductor interface circuit without keeping a sufficiently high driving capability thereof.

Figure 3:
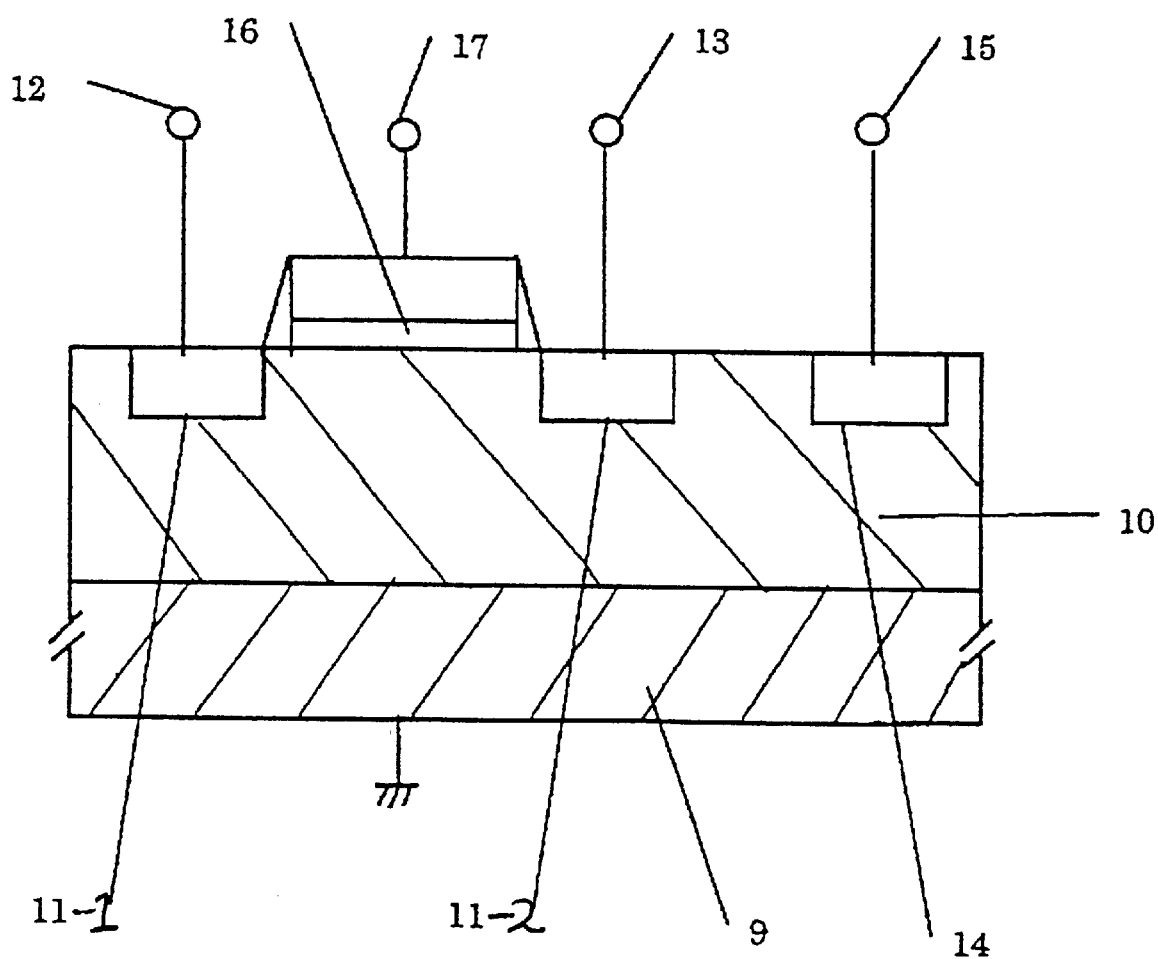
FIG. 3 is a fragmentary cross sectional elevation view illustrative of the above depletion type MOS field effect transistor formed in a p-type well region over a p-type semiconductor substrate in first to fourth embodiments in accordance with the present invention.

FIG. 3 is a fragmentary cross sectional elevation view illustrative of the above depletion type MOS field effect transistor 7 formed in a p-type well region over a p-type semiconductor substrate. A p-type semiconductor substrate 9 is grounded A p-type well region 10 is formed on the p-type semiconductor substrate 9. An n-type source diffusion region 11-1 and an n-type drain diffusion region 11-2 are selectively formed in an upper region of the p-type well region 10. A p-type diffusion region 14 is selectively formed in the upper region of the p-type well region 10 for fixing a well potential of the Hype well region 10. A source electrode 12 is connected to the source diffusion region 11-1. A drain electrode 13 is connected to the drain diffusion region 11-2. A well potential fixing electrode 15 is connected to the p-type diffusion region 14. The well potential fixing electrode 15 is also grounded to fix the potential of the p-type well region 10 at a lowest potential. A gate oxide film 16 is formed on the p-type well region 10. A channel region is defined between the source and drain diffusion regions 11-1 and 11-2 and positioned under the gate oxide film 16. A gate electrode 17 is formed on the gate oxide film 16. Side wall oxide films are optionally formed on side walls of the gate electrode 17. An impurity concentration of the channel region is adjusted to have a threshold voltage be 0V or less.

Figure 4:
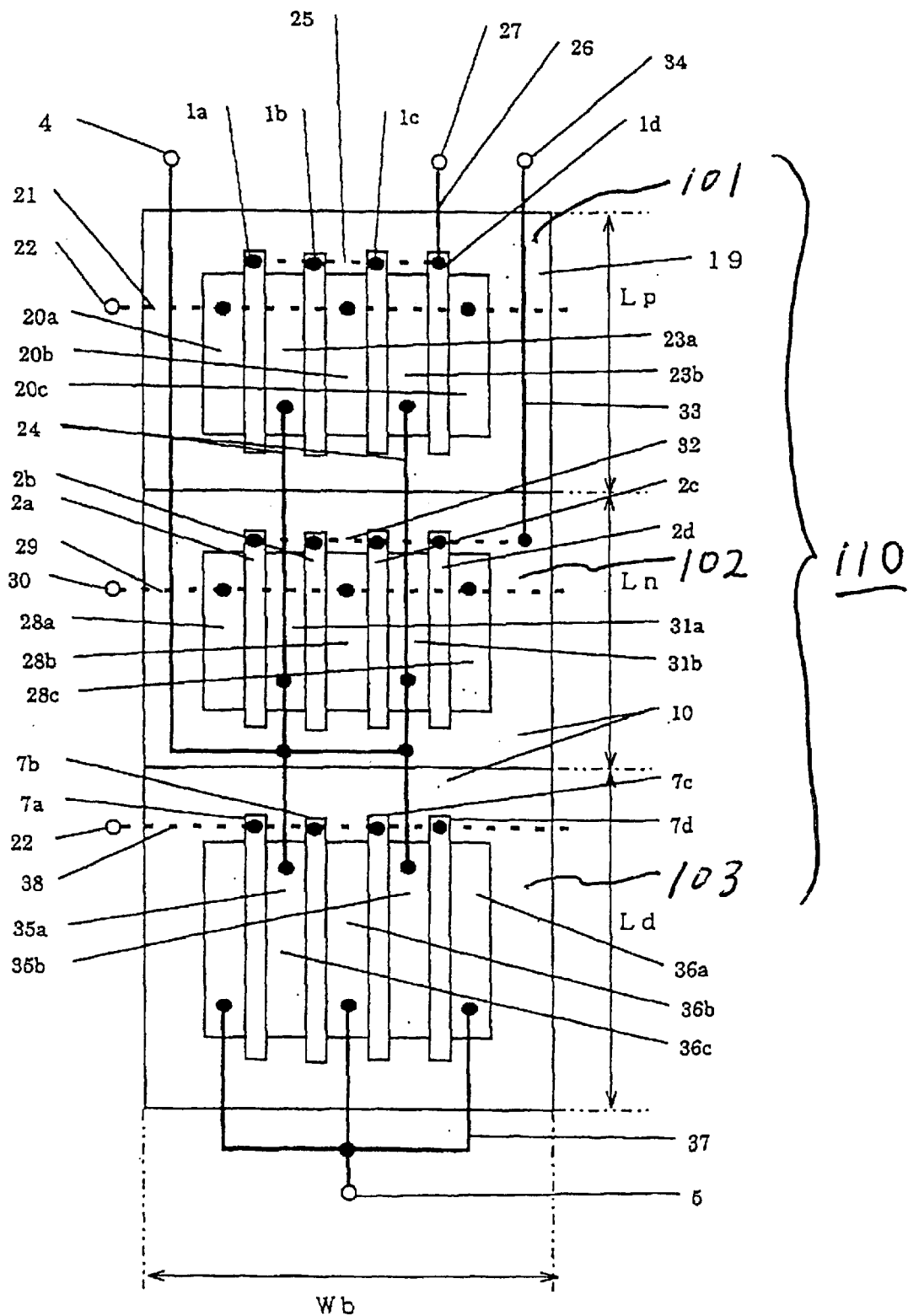
FIG. 4 is a plan view illustrative of a layout of the novel semiconductor interface circuit in first and second embodiments in accordance with the present invention.

FIG. 4 is a plan view illustrative of a layout of the above novel semiconductor interface circuit. The p-type enhancement MOS field effect transistor 1 of the complementary MOS circuit of the buffer circuit 3 is provided in a first cell region 101 which corresponds to the n-type well region 19. The n-type enhancement MOS field effect transistor 2 of the complementary MOS circuit of the buffer circuit 3 is provided in a second cell region 102 which corresponds to the p-type well region 10. The depletion type MOS field effect transistor 7 is provided in a third cell region 103 which corresponds to the p-type well region 10. The first cell region 101 is rectangular-shaped to have a common width "Wb" and a first length "Lp". The second cell region 102 is rectangular-shaped to have the common width "Wb" and a second length "Ln". The third cell region 103 is rectangular-shaped to have the common width "Wb" and a third length "Ld". The first, second and third cell regions 101, 102 and 103 have the same or common width "Wb". The first, second and third cell regions 101, 102 and 103 are aligned in a length direction to form a cell unit 110 having the common width "Wb" and the total length of the first, second and third lengths "Lp", "Ln" and "Ld", so that the semiconductor interface circuit is provided on the rectangular-shaped cell unit 110.

In the first cell region 101, the p-type enhancement MOS field effect transistor 1 of the complementary MOS circuit of the buffer circuit 3 is divided into four parts so that there are provided four gate electrodes 1a, 1b, 1c and 1d, and three source regions 20a, 20b and 20c as well as two drain regions 23a and 23b. The three source regions 20a, 20b and 20c are connected through a first level aluminum interconnection 21 to a power terminal 22 through which a power voltage is supplied. The two drain regions 23a and 23b are connected through a second level aluminum interconnection 24 to an output node 4. The four gate electrodes 1a, 1b, 1c and 1d are connected through first and second level aluminum interconnections 25 and 26 to a gate electrode 27 of the p-type MOS field effect transistor.

In the second cell region 102, the n-type enhancement MOS field effect transistor 2 of the complementary MOS circuit of the buffer circuit 3 is divided into four parts so that there are provided four gate electrodes 2a, 2b, 2c and 2d, and three source regions 28a, 28b and 28c as well as two drain regions 31a and 31b. The three source regions 28a, 28b and 28c are connected through a first level aluminum interconnection 29 to a ground terminal 30 through which a ground voltage is supplied. The two drain regions 31a and 31b are connected through the second level aluminum interconnection 24 to the output node 4. The four gate electrodes 2a, 2b, 2c and 2d are connected through first and second level aluminum interconnections 32 and 33 to a gate electrode 34 of the n-type MOS field effect transistor.

In the third cell region 103, the depletion type MOS field effect transistor 7 is divided into four parts so that there are provided four gate electrodes 7a, 7b, 7c and 7d, and two source regions 35a and 35b as well as three drain regions 36a, 36b and 36c. The two source regions 35a and 35b are connected through the second level aluminum interconnection 24 to the output node 4. The three drain legions 36a, 36b and 36c are connected through second level aluminum interconnection 37 to the input/output pad 5. The four gate electrodes 7a, 7b, 7c and 7d are connected through a first level aluminum interconnection 38 to the power terminal 22. The inventor gate 38 is formed in the first semiconductor integrated circuit. Namely, the inventor gate 38 is positioned out of the rectangular-shaped interface cell unit 110. As a result, a cell-base semiconductor integrated circuit is obtained which includes the interface cell unit 110

Figure 5:
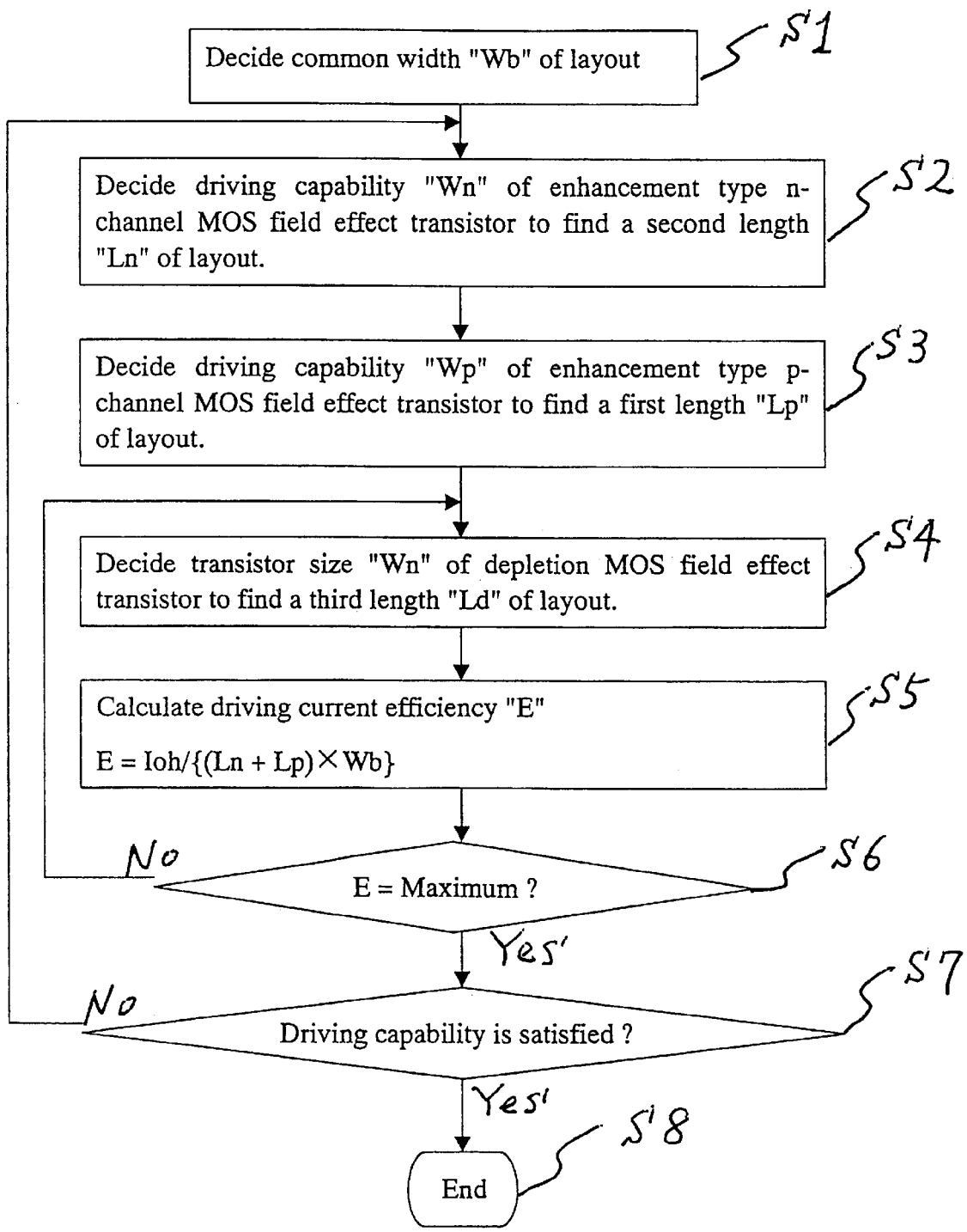
FIG. 5 is a flow chart illustrative of a method of deciding transistor sizes of the depletion type MOS field effect transistor for optimizing the layout of the p-channel and n-channel enhancement type MOS field effect transistors of the buffer circuit as well as the depletion type MOS field effect transistor so as to maximize the driving current efficiency for optimization of the layout in first and third embodiments in accordance with the present invention.

In order to maximize the driving current efficiency, the above layout is optimized as follows by deciding the optimum first, second and third lengths and the common width of the first, second and third cell regions 101, 102 and 103. FIG. 5 is a flow chart illustrative of a method of deciding transistor sizes of the above depletion type MOS field effect transistor for opting the layout of the p-channel and n-channel enhancement type MOS field effect transistors 1 and 2 of the buffer circuit 3 as well as the depletion type MOS field effect transistor 7 so as to maximize the driving current efficiency for optimization of the above layout.

In the first step S1, a common width "Wb" is decided of the first, second and third cell regions 101, 102 and 103. For example, it is possible that the common width "Wb" is decided to be the same as a pitch or wider than the pitch by integer times.

In the second step S2, a driving capability "Wn" of the n-channel enhancement type MOS field effect transistor 2 of the buffer circuit 3 to decide the second length "Ln" of the second cell region 102 based upon the common width "Wb".

In the third step S3, a driving capability "Wn" of the p-channel enhancement type MOS field effect transistor 1 of the buffer circuit 3 to decide the first length "Lp" of the first cell region 101 based upon the common width "Wb".

In the fourth step S4, the transistor size "Wd", for example, the channel length and channel width, of the depletion type MOS field effect transistor 7 is decided to find the first length "Lp" of the third cell region 103 on which the depletion MOS field effect transistor 7 is provided, wherein initially the transistor size "Wd" is set to be smaller than a presumable size.

In the fifth step S5, by use of the known and available circuit simulator such as simulation program with integrated circuit emphasis (SPICE), an output voltage of the input/output pad 5 is set to be the same level as the high voltage as the power voltage so as to evaluate a current flowing from the input/output pad 5 under the condition of setting the voltage lower than the power voltage VDD by 0.4V for obtaining a driving current Ioh flowing through the input/output voltage. Subsequently, the driving current is subjected to a division by a total layout area of the first and second cell regions 101 and 102 to find a driving current efficiency "E" defined to be the driving current Ioh per a unit area of the buffer circuit 3 in accordance with the following equation.

$$E = Ioh/[\{(Lp+Ln)\} \times Wb]$$

Figure 6:
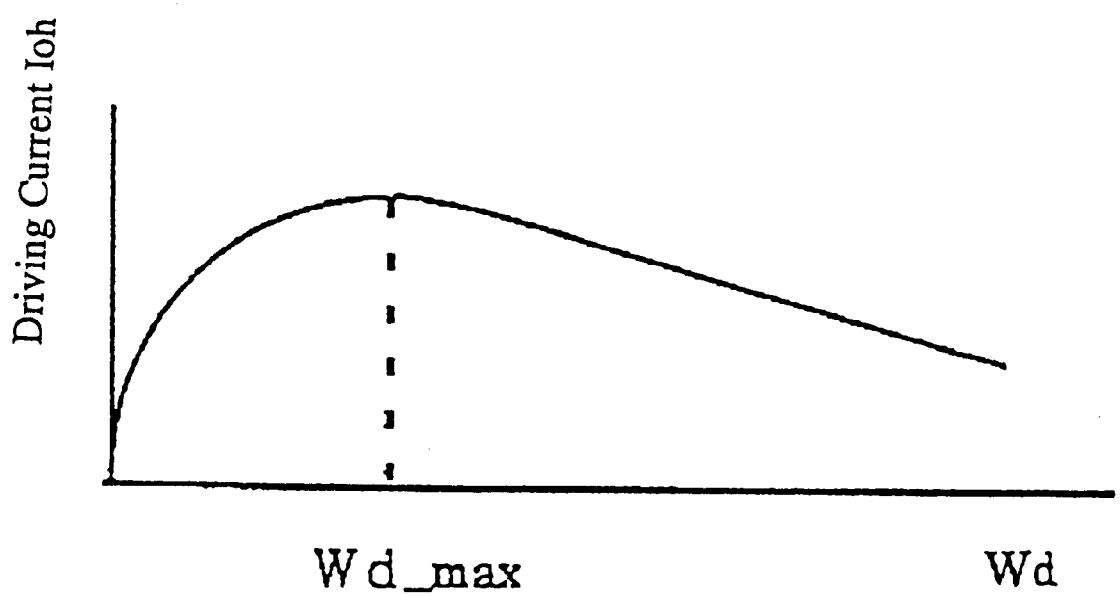
FIG. 6 is a diagram illustrative of variations in output driving current from a depletion type MOS field effect transistor flowing through an input/output pad of a second semiconductor integrated circuit.

In the sixth step S6, it is verified if the driving current efficiency "E" is the maximum If the driving current efficiency "E" is not the maximum, then the process enters back to the fourth step S4 so that the transistor size "Wd" of the depletion MOS field effect transistor 7 is increased by a small increment for subsequent fining the third length of the third cell region 103 before entry into the fifth step S5 again. In this fifth step S5, a new driving current Ioh flowing through the input/output voltage is calculated by the circuit simulator in the above manner. Subsequently, the newly calculated driving current is subjected to the division by the total layout area to find a new driving current efficiency "E" defined to be the driving current Ioh per a unit area of the buffer circuit 3, so that it is verified if the driving current efficiency "E" is the maximum. The above loop processes will be repeated to obtain the driving current curve illustrative of variation in driving current "Ioh" over transistor size "Wd" of the depletion type MOS field effect transistor 7 in FIG. 6 so that the obtained driving capability curve provides information about the optimum transistor size "WdMAX" for obtaining the maximum driving current. Once the maximum driving current efficiency "E" could be verified, then the process will enter into the following step.

In the seventh step S7, it is verified if the driving capability satisfies the requirement If the driving capability is less than the required range, then the process will back to the second step S2 so that the driving capability "Wn" of the n-channel enhancement type MOS field effect transistor 2 is increased to find the second length "L" of the second cell region 102. Subsequently, the process will enter into the third step S3 so that the driving capability "Wp" of the p-channel enhancement type MOS field effect transistor 1 is also increased to find the first length "Lp" of the second cell region 101. The above fourth, fifth and sixth steps S4, S5 and S6 are again conducted until it could be verified that the driving capability satisfies the requirement. If, however, the driving capability is more than the required range, then the process will back to the second step S2 so that the driving capability "Wn" of the n-channel enhancement type MOS field effect transistor 2 is deceased to find the second length "Ln" of the second cell region 102. Subsequently, the process will enter into the third step S3 so that the driving capability "Wp" of the p-channel enhancement type MOS field effect transistor 1 is also decreased to find the first length "Lp" of the second cell legion 101. The above fourth, fifth and sixth steps S4, S5 and S6 are again conducted until it could be verified that the driving capability satisfies the requirement.

If the driving capability satisfies the requirement, then the process will end in the eighth step S8.

Second Embodiment

Figure 7:
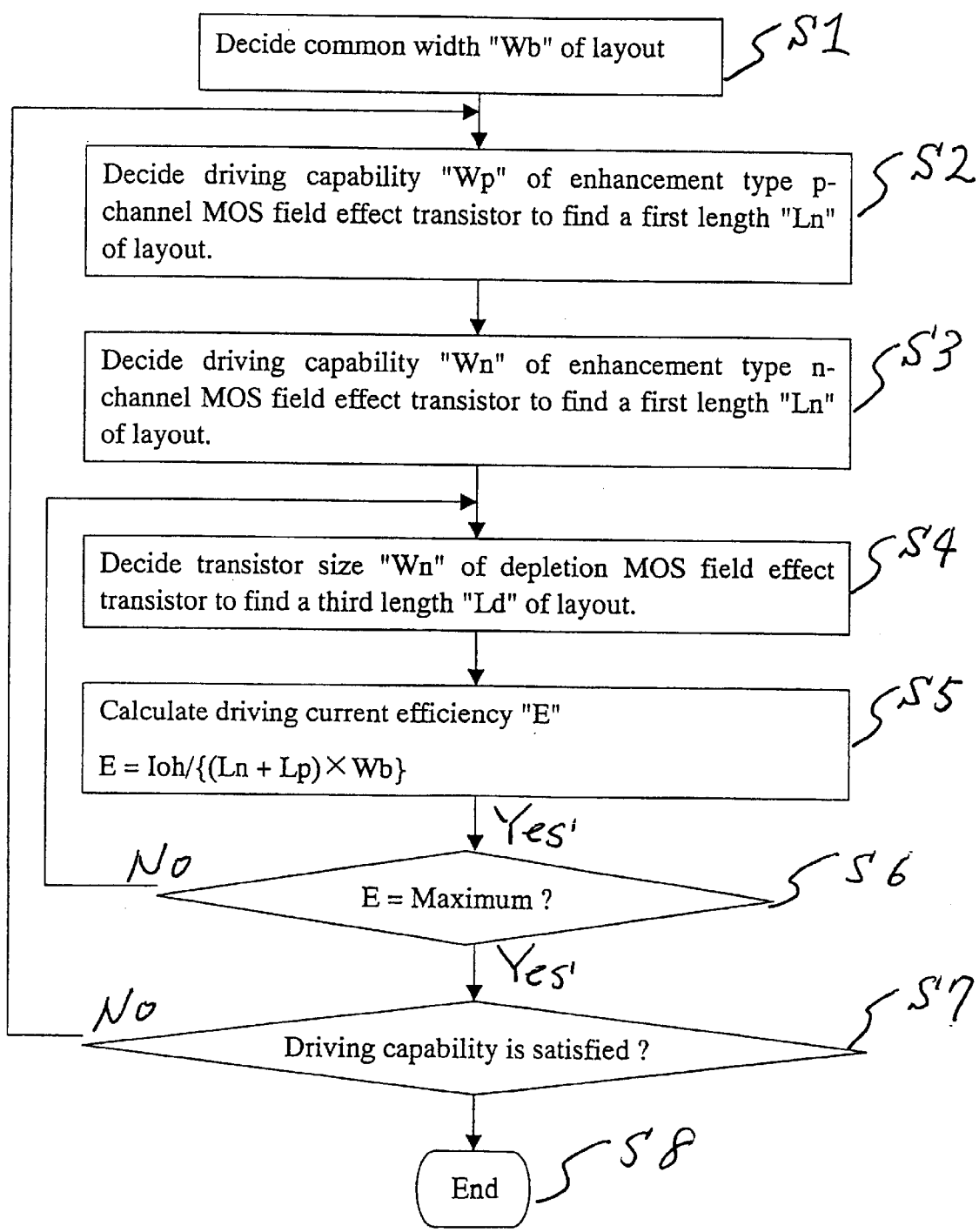
FIG. 7 is a flow chart illustrative of a method of deciding transistor sizes of the above depletion type MOS field effect transistor for optimizing the layout of the p-channel and n-channel enhancement type MOS field effect transistors of the buffer circuit as well as the depletion type MOS field effect transistor so as to maximize the driving current efficiency for optimization of the layout in second and fourth embodiments in accordance with the present invention.

A second embodiment according to the present invention will be described in detail. A difference of the second embodiment from the first embodiment is only in the sequence of the second and third steps of the transistor size optimization process for the depletion MOS field effect transistor as illustrated in FIG. 7.

With reference again to FIG. 2, the novel semiconductor interface circuit is connected between a first semiconductor integrated circuit driven by a first power voltage level and a second semiconductor integrated circuit driven by a second power voltage level which is higher than the first power voltage level. Illustrations of the first and second semiconductor integrated circuits are omitted. The novel semiconductor interface circuit comprises an output buffer circuit 3 which is represented by a rectangular shaped frame of broken lines and a depletion type MOS field effect transistor 7 which is represented by a rectangular shaped frame of broken lines. The output buffer circuit 3 comprises a complementary MOS circuit having an input side connected to the first semiconductor integrated circuit and an output node 4 connected to the depletion type MOS field effect transistor 7. The depletion type MOS field effect transistor 7 is connected in series between the output node 4 of the complementary MOS circuit and an input/output pad 5 of the second semiconductor integrated circuit. The depletion type MOS field effect transistor 7 is an n-channel type. The complementary MOS circuit comprises a series connection of a p-channel enhancement type MOS field effect transistor 1 and an n-channel enhancement type MOS field effect transistor 2 between a power voltage line 6 and a ground line. The p-channel enhancement type MOS field effect transistor 1 and the n-channel enhancement type MOS field effect transistor 2 serve as first and second driver transistors. Gate electrodes of the p-channel enhancement type MOS field effect transistor 1 and the n-channel enhancement type MOS field effect transistor 2 are connected to the output side of the first semiconductor integrated circuit for receiving output signals from the fist semiconductor integrated circuit. A gate electrode of the depletion type MOS field effect transistor 7 is also connected to the power voltage line 6. The output node 4 of the complementary MOS circuit is connected to an input side of an inventor gate 8 having an output side connected to the first semiconductor integrated circuit.

It is essential for the present invention that the depletion type MOS field effect transistor 7 is designed to have a driving capability which is substantially equal to or near a driving capability of the output buffer circuit 3. For example, a difference in driving capability between the depletion type MOS field effect transistor 7 and the output buffer circuit 3 is within 10% of a range of variation in driving capability on manufacturing of the depletion type MOS field effect transistor and the output buffer circuit. What the driving capability of the depletion type MOS field effect transistor 7 is substantially equal to or near the driving capability of the output buffer circuit 3 makes it possible to maximize a driving current efficiency defined to be a quotient obtained by dividing a driving current flowing through the input/output pad 5 by a total layout area of both the output buffer circuit 3 and the depletion type MOS field effect transistor 7 or by a layout area of the output buffer circuit 3. This maximization of the driving current efficiency of the semiconductor interface circuit allows an increase in degree of integration of the semiconductor interface circuit without keeping a sufficiently high driving capability thereof.

With reference again to FIG. 3, a p-type semiconductor substrate 9 is grounded. A p-type well region 10 is formed on the p-type semiconductor substrate 9. An n-type source diffusion region 11-1 and an n-type drain diffusion region 11-2 are selectively formed in an upper region of the p-type well region 10. A p-type diffusion region 14 is selectively formed in the upper region of the p-type well region 10 for fixing a well potential of the p-type well region 10. A source electrode 12 is connected to the source diffusion region 11-1. A drain electrode 13 is connected to the drain diffusion region 11-2. A well potential fixing electrode 15 is connected to the p-type diffusion region 14. The well potential fixing electrode 15 is also grounded to fix the potential of the p-type well region 10 at a lowest potential. A gate oxide film 16 is formed on the p-type well region 10. A channel region is defined between the source and drain diffusion regions 11-1 and 11-2 and positioned under the gate oxide film 16. A gate electrode 17 is formed on the gate oxide film 16. Side wall oxide films optionally formed on side walls of the gate electrode 17. An impurity concentration of the channel region is adjusted to have a threshold voltage be 0V or less.

With reference again to FIG. 4, the p-type enhancement MOS field effect transistor 1 of the complementary MOS circuit of the buffer circuit 3 is provided in a first cell region 101 which corresponds to the n-type well region 19. The n-type enhancement MOS field effect transistor 2 of the complementary MOS circuit of the buffer circuit 3 is provided in a second cell region 102 which corresponds to the p-type well region 10. The depletion type MOS field effect transistor 7 is provided in a third cell region 103 which corresponds to the p-type well region 10. The first cell region 101 is rectangular-shaped to have a common width "Wb" and a first length "Lp". The second cell region 102 is rectangular-shaped to have the common width "Wb" and a second length "Ln". The third cell region 103 is rectangular-shaped to have the common width "Wb" and a third length "Ld". The first, second and third cell regions 101, 102 and 103 have the same or common width "Wb". The first, second and third cell regions 101, 102 and 103 awe aligned in a length direction to form a cell unit 110 having the common width "Wb" and the total length of the first, second and third lengths "Lp", "Ln" and "Ld", so that the semiconductor interface circuit is provided on the rectangular-shaped cell unit 110.

In the first cell region 101, the p-type enhancement MOS field effect transistor 1 of the complementary MOS circuit of the buffer circuit 3 is divided into four parts so that there are provided four gate electrodes 1a, 1b, 1c and 1d, and three source regions 20a, 20b and 20c as well as two drain regions 23a and 23b. The three source regions 20a, 20b and 20c are connected through a first level aluminum interconnection 21 to a power terminal 22 through which a power voltage is supplied. The two drain regions 23a and 23b are connected through a second level aluminum interconnection 24 to an output node 4 The four gate electrodes 1a, 1b, 1c and 1d are connected through first and second level aluminum interconnections 25 and 26 to a gate electrode 27 of the p-type MOS field effect transistor.

In the second cell region 102, the n-type enhancement MOS field effect transistor 2 of the complementary MOS circuit of the buffer circuit 3 is divided into four parts so that there are provided four gate electrodes 2a, 2b, 2c and 2d, and three source regions 28a, 28b and 28c as well as two drain regions 31a and 31b. The three source regions 28a, 28b and 28c are connected through a first level aluminum interconnection 29 to a ground terminal 30 through which a ground voltage is supplied. The two drain regions 31a and 31b are connected through the second level aluminum interconnection 24 to the output node 4. The four gate electrodes 2a, 2b, 2c and 2d are connected through first and second level aluminum interconnections 32 and 33 to a gate electrode 34 of the n-type MOS field effect transistor.

In the third cell region 103, the depletion type MOS field effect transistor 7 is divided into four parts so that there are provided four gate electrodes 7a, 7b, 7c and 7d, and two source regions 35a and 35b as well as three drain regions 36a, 36b and 36c. The two source regions 35a and 35b are connected through the second level aluminum interconnection 24 to the output node 4. The three drain regions 36a, 36b and 36c are connected through second level aluminum interconnection 37 to the input/output pad 5. The four gate electrodes 7a, 7b, 7c and 7d are connected through a first level aluminum interconnection 38 to the power terminal 22. The inventor gate 38 is formed in the first semiconductor integrated circuit. Namely, the inventor gate 38 is positioned out of the rectangular-shaped interface cell unit 110. As a result, a cell-base semiconductor integrated circuit is obtained which includes the interface cell unit 110.

In order to maximize the driving current efficiency, the above layout is optimized as follows by deciding the optimum first, second and third lengths and the common width of the first, second and third cell regions 101, 102 and 103. FIG. 7 is a flow chart illustrative of a method of deciding transistor sizes of the above depletion type MOS field effect transistor for optimizing the layout of the p-channel and n-channel enhancement type MOS field effect transistors 1 and 2 of the buffer circuit 3 as well as the depletion type MOS field effect transistor 7 so as to maximize the driving current efficiency for optimization of the above layout.

In the first step S1, a common width "Wb" is decided of the first, second and third cell regions 101, 102 and 103. For example, it is possible that the common width "Wb" is decided to be the same as a pitch or wider than the pitch by integer times.

In the second step S2, a driving capability "Wn" of the p-channel enhancement type MOS field effect transistor 1 of the buffer circuit 3 to decide the first length "Lp" of the first cell region 101 based upon the common width "Wb."

In the third step S3, a driving capability "Wn" of the n-channel enhancement type MOS field effect transistor 2 of the buffer circuit 3 to decide the second length "Ln" of the second cell region 102 based upon the common width "Wb".

In the fourth step S4, the transistor size "Wd", for example, the channel length and channel width, of the depletion type MOS field effect transistor 7 is decided to find the first length "Lp" of the third cell region 103 on which the depletion MOS field effect transistor 7 is provided, wherein initially the transistor size "Wd" is set to be smaller than a presumable size.

In the fifth step S5, by use of the known and available circuit simulator such as simulation program with integrated circuit emphasis (SPICE), an output voltage of the input/output pad 5 is set to be the same level as the high voltage as the power voltage so as to evaluate a current flowing from the input/output pad 5 under the condition of setting the voltage lower than the power voltage VDD by 0.4V for obtaining a driving current Ioh flowing through the input/output voltage. Subsequently, the driving current is subjected to a division by a total layout area of the first and second cell regions 101 and 102 to find a driving current efficiency "E" defined to be the driving current Ioh per a unit area of the buffer circuit 3 in accordance with the following equation.

$$E=Ioh/[\{(Lp+Ln)\} \times Wb]$$

In the sixth step S6, it is verified if the driving current efficiency "E" is the maximum. If the driving current efficiency "E" is not the maximum, then the process enters back to the fourth step S4 so that the transistor size "Wd" of the depletion MOS field effect transistor 7 is increased by a small increment for subsequent fining the third length of the third cell region 103 before entry into the fifth step S5 again. In this fifth step S5, a new driving current Ioh flowing through the input/output voltage is calculated by the circuit simulator in the above manner. Subsequently, the newly calculated driving current is subjected to the division by the total layout area to find a new driving current efficiency "E" defined to be the driving current Ioh per a unit area of the buffer circuit 3, so that it is verified if the driving current efficiency "E" is the maximum. The above loop processes will be repeated to obtain the driving current curve illustrative of variation in driving current "Ioh" over transistor size "Wd" of the depletion type MOS field effect transistor 7 in FIG. 6 so that the obtained driving capability curve provides informations about the optimum transistor size "WdMAX" for obtaining the maximum driving current. Once the maximum driving current efficiency "E" could be verified, then the process will enter into the following step.

In the seventh step S7, it is verified if the driving capability satisfies the requirement. If the driving capability is less than the required range, then the process will back to the second step S2 so that the driving capability "Wp" of the p-channel enhancement type MOS field effect transistor 1 is increased to find the first length "Lp" of the first cell region 101. Subsequently, the process will enter into the third step S3 so that the driving capability "Wn" of the -n-channel enhancement type MOS field effect transistor 2 is also increased to find the second length "Ln" of the second cell region 101. The above fourth, fifth and sixth steps S4, S5 and S6 are again conducted until it could be verified that the driving capability satisfies the requirement. If, however, the driving capability is more than the required range, then the process will back to the second step S2 so that the driving capability "Wp" of the p-channel enhancement type MOS field effect transistor 2 is deceased to find the first length "Lp" of the first cell region 101. Subsequently, the process will enter into the third step S3 so that the driving capability "Wn" of the n-channel enhancement type MOS field effect transistor 2 is also decreased to find the second length "Lp"

of the second cell region 101. The above fourth, fifth and sixth steps S4, S5 and S6 are again conducted until it could be verified that the driving capability satisfies the requirement.

If the driving capability satisfies the requirement, then the process will end in the eighth step S8.

Third Embodiment

Figure 8:
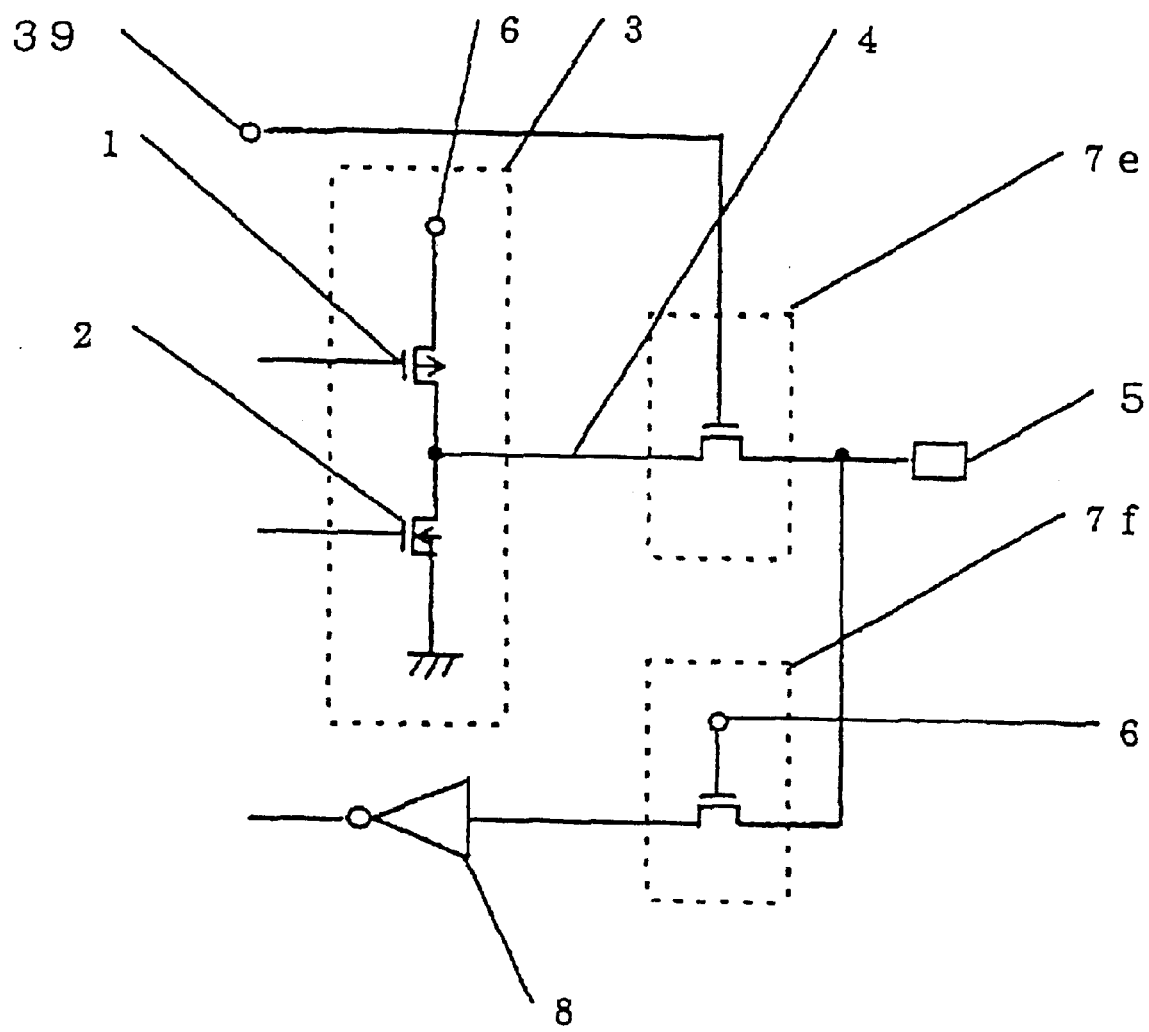
FIG. 8 is a circuit diagram illustrative of a novel semiconductor interface circuit between two semiconductor integrated circuits driven by different power voltage levels, wherein two depletion type MOS field effect transistors are provided for input and output sides respectively in second and fourth embodiments in accordance with the present invention.

A third embodiment according to the present invention will be described in detail. A difference of this third embodiment from the first embodiment is only in the circuit configuration of the interface circuit. FIG. 8 is a circuit diagram illustrative of a novel semiconductor interface circuit between two semiconductor integrated circuits driven by different power voltage levels, wherein two depletion type MOS field effect transistors are provided for input and output sides respectively. The novel semiconductor interface circuit is connected between a first semiconductor integrated circuit driven by a first power voltage level and a second semiconductor integrated circuit driven by a second power voltage level which is higher than the first power voltage level. Illustrations of the first and second semiconductor integrated circuits are omitted. The novel semiconductor interface circuit comprises an output buffer circuit 3 which is represented by a rectangular shaped frame of broken lines and first and second depletion type MOS field effect transistors 7e and 7f which are represented by rectangular shaped frames of broken lines. The output buffer circuit 3 comprises a complementary MOS circuit having an input side connected to the first semiconductor integrated circuit and an output node 4 connected to the depletion type MOS field effect transistor 7. The first depletion type MOS field effect transistor 7e is connected in series between the output node 4 of the complementary MOS circuit and an input/output pad 5 of the second semiconductor integrated circuit. The depletion type MOS field effect transistor 7 is an n-channel type. The complementary MOS circuit comprises a series connection of a p-channel enhancement type MOS field effect transistor 1 and an n-channel enhancement type MOS field effect transistor 2 between a power voltage line 6 and a ground line. The p-channel enhancement type MOS field effect transistor 1 and the n-channel enhancement type MOS field effect transistor 2 serve as first and second driver transistors. Gate electrodes of the p-channel enhancement type MOS field effect transistor 1 and the n-channel enhancement type MOS field effect transistor 2 are connected to the output side of the first semiconductor integrated circuit for receiving output signals from the first semiconductor integrated circuit. A gate electrode of the depletion type MOS field effect transistor 7 is also connected to a control signal line 39. The second depletion type MOS field effect transistor 7f is connected in series between the input/output side 5 of the second semiconductor integrated circuit and an input side of an inventor gate 8 having an output side connected to the fly semiconductor integrated circuit. A gate of the second depletion type MOS field effect transistor 7f is connected to the power voltage line 6. The second depletion type MOS field effect transistor 7f is an n-channel type.

It is essential for the present invention that the first depletion type MOS field effect transistor 7e is designed to have a driving capability which is substantially equal to or near a driving capability of the output buffer circuit 3. For example, a difference in driving capability between the fast depletion type MOS field effect transistor 7e and the output buffer circuit 3 is within 10% of a range of variation in driving capability on manufacturing of the depletion type MOS field effect transistor and the output buffer circuit. What the driving capability of the first depletion type MOS field effect transistor 7e is substantially equal to or near the driving capability of the output buffer circuit 3 makes it possible to maximize a driving current efficiency defied to be a quotient obtained by dividing a driving current flowing through the input/output pad 5 by a total layout area of both the output buffer circuit 3 and the depletion type MOS field effect transistor 7 or by a layout area of the output buffer circuit 3. This maximization of the driving current efficiency of the semiconductor interface circuit allows an increase in degree of integration of the semiconductor interface circuit without keeping a sufficiently high driving capability thereof.

With reference again to FIG. 3, each of the first and second depletion type MOS field effect transistors 7e and 7f is formed in a p-type well region. A p-type semiconductor substrate 9 is grounded. A p-type well region 10 is formed on the p-type semiconductor substrate 9. An n-type source diffusion region 11-1 and an n-type drain diffusion region 11-2 are selectively formed in an upper region of the p-type well region 10. A p-type diffusion region 14 is selectively formed in the upper region of the p-type well region 10 for fixing a well potential of the p-type well region 10. A source electrode 12 is connected to the source diffusion region 11-1. A drain electrode 13 is connected to the drain diffusion region 11-2. A well potential fixing electrode 15 is connected to the p-type diffusion region 14. The well potential fixing electrode 15 is also grounded to fix the potential of the p-type well region 10 at a lowest potential. A gate oxide film 16 is formed on the p-type well region 10. A channel region is defined between the source and drain diffusion regions 11-1 and 11-2 and positioned under the gate oxide film 16. A gate electrode 17 is formed on the gate oxide film 16. Side wall oxide films optionally formed on side walls of the gate electrode 17. An impurity concentration of the channel region is adjusted to have a threshold voltage be 0V or less.

Figure 9:
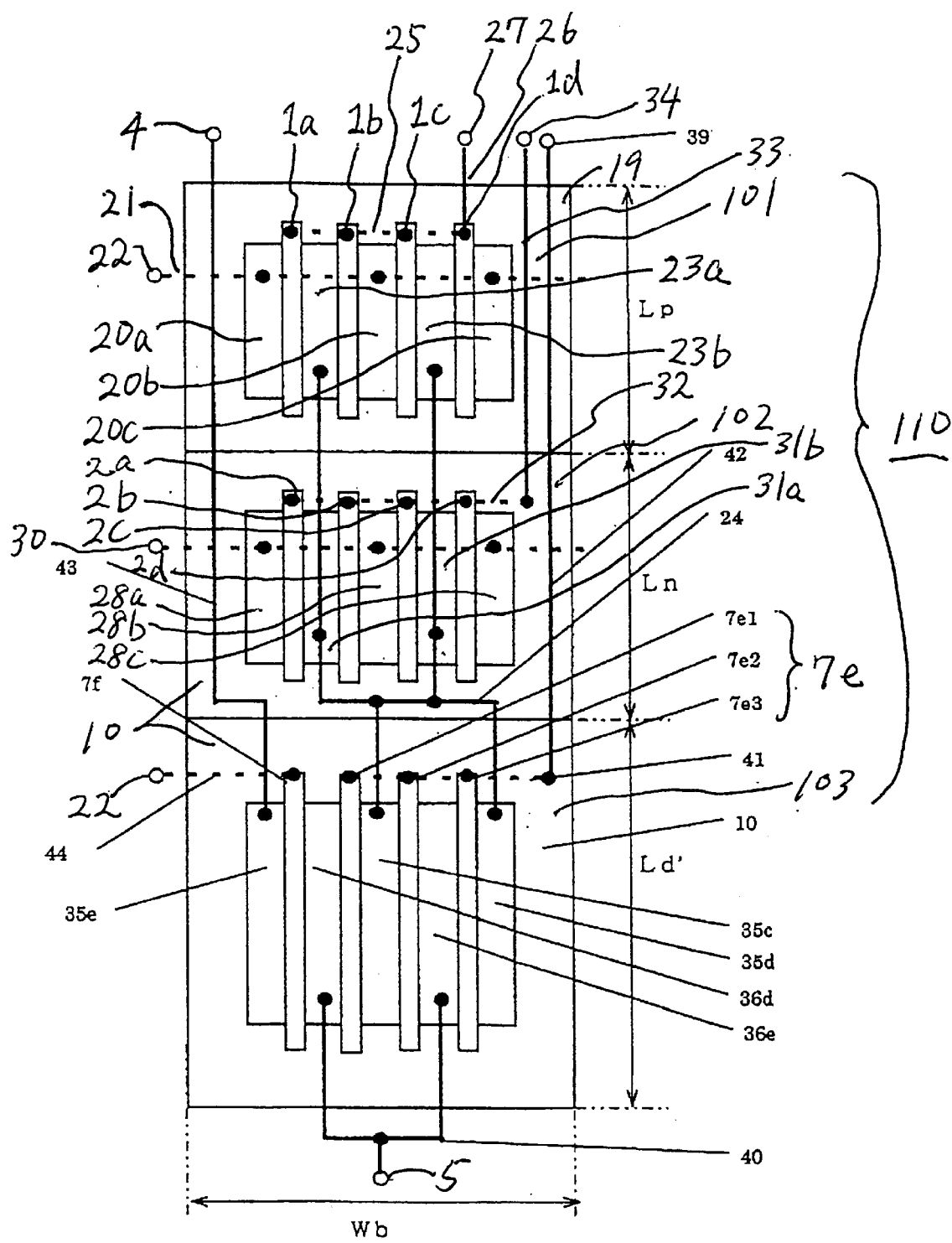
FIG. 9 is a plan view illustrative of a layout of the novel semiconductor interface circuit in second and fourth embodiments in accordance with the present invention.

FIG. 9 is a plane view illustrative of a layout of the above novel semiconductor interface circuit. The p-type enhancement MOS field effect transistor 1 of the complementary MOS circuit of the buffer circuit 3 is provided in a first cell region 101 which corresponds to the n-type well region 19. The n-type enhancement MOS field effect transistor 2 of the complementary MOS circuit of the buffer circuit 3 is provided in a second cell region 102 which corresponds to the p-type well region 10. The depletion type MOS field effect transistor 7 is provided in a third cell region 103 which corresponds to the p-type well region 10. The first cell region 101 is rectangular-shaped to have a common width "Wb" and a fist length "Lp". The second cell region 102 is rectangular-shaped to have the common width "Wb" and a second length "Ln". The third cell region 103 is rectangular-shaped to have the common width "Wb" and a third length "Ld". The first, second and third cell regions 101, 102 and 103 have the same or common width "Wb". The first, second and third cell regions 101, 102 and 103 are aligned in a length direction to form a cell unit 110 having the common width "Wb" and the total length of the first, second and third lengths "Lp", "Ln" and "Ld", so that the semiconductor interface circuit is provided on the rectangular-shaped cell unit 110.

In the fist cell region 101, the p-type enhancement MOS field effect transistor 1 of the complementary MOS circuit of the buffer circuit 3 is divided into four parts so that there are provided four gate electrodes 1a, 1b, 1c and 1d, and three source regions 20a, 20b and 20c as well as two drain regions 23a and 23b. The three source regions 20a, 20b and 20c are connected through a fist level aluminum interconnection 21 to a power terminal 22 through which a power voltage is supplied. The two drain regions 23a and 23b are connected to second level aluminum interconnections 24. The four gate electrodes 1a, 1b, 1c and 1d are connected through first and second level aluminum interconnections 25 and 26 to a gate electrode 27 of the p-type MOS field effect transistor.

In the second cell region 102, the n-type enhancement MOS field effect transistor 2 of the complementary MOS circuit of the buffer circuit 3 is divided into four parts so that there are provided four gate electrodes 2a, 2b, 2c and 2d, and three source regions 28a, 28b and 28c as well as two drain regions 31a and 31b. The three source regions 28a, 28b and 28c are connected through a first level aluminum interconnection 29 to a ground terminal 30 through which a ground voltage is supplied The two drain regions 31a and 31b are connected to the second level aluminum interconnection 24. The four gate electrodes 2a, 2b, 2c and 2d are connected through first and second level aluminum interconnections 32 and 33 to a gate electrode 34 of the n-type MOS field effect transistor.

In the third cell region 103, the first depletion type MOS field effect transistor 7e is divided into three parts so that there are provided three gate electrodes 7e1, 7e2 and 7e3, and two source regions 35c and 35d as well as two drain regions 36d and 36e The second depletion type MOS field effect transistor 7f comprises a single part which is provided with a single gate electrode 7f1, and a single source region 35e as well as the single drain region 36d. The two source regions 35c and 35d of the first depletion type MOS field effect transistor 7e are connected to the second level aluminum interconnection 24. The two drain regions 36d and 36e of the first depletion type MOS field effect transistor 7e are connected through second level aluminum interconnections 40 to the input/output pad 5. The three gate electrodes 7e1, 7e2 and 7e3 of the first depletion type MOS field effect transistor 7e are connected through a first level aluminum interconnection 41 and the second level interconnection 42 to the control signal line 39. The inventor gate 38 of the first depletion type MOS field effect transistor 7e is formed in the first semiconductor integrated circuit. Namely, the inventor gate 38 of the first depletion type MOS field effect transistor 7e is positioned out of the rectangular-shaped interface cell unit 110. The single source region 35c of the second depletion type MOS field effect transistor 7f is connected through a second level aluminum interconnection 43 to the output node 4 of the buffer circuit 3. The single drain region 36d of the second depletion type MOS field effect transistor 7f is common to the first depletion type MOS field effect transistor 7e and thus is connected through second level aluminum interconnection 40 to the input/output pad 5. The single gate electrode 7f of the second depletion type MOS field effect transistor 7f is connected through a first level aluminum interconnection 44 to the power voltage line 22. The inventor gate 38 of the first depletion type MOS field effect transistor 7e is formed in the first semiconductor integrated circuit. Namely, the inveltor gate 38 of the first depletion type MOS field effect transistor 7e is positioned out of the rectangular-shaped interface cell unit 110.

As a result, a cell-base semiconductor integrated circuit is obtained which includes the interface cell unit 110.

As compared to the first embodiment, the number of the parts, into which the first depletion type MOS field effect transistor 7e as the output side transistor is divided, is less by one. Namely, in the first embodiment, the depletion type MOS field effect transistor 7 as the input/output side transistor is divided into the four parts, whilst in the second embodiment the first depletion type MOS field effect transistor 7e as the output side transistor is divided into the three parts, for which reason in order to keep the required driving capability, the third length "Ld" of the third cell region 103 of this embodiment is set longer by about 1.3 times than the third length "Ld" of the third cell region of the first embodiment.

In order to maximize the driving current efficiency, the above layout is optimized as follows by deciding the optimum first, second and third lengths and the common width of the first, second and third cell regions 101, 102 and 103. With reference again to FIG. 5, there will be described a method of deciding transistor sizes of the above depletion type MOS field effect transistor for optimizing the layout of the p-channel and n-channel enhancement type MOS field effect transistors 1 and 2 of the buffer circuit 3 as well as the depletion type MOS field effect transistor 7 so as to maximize the driving current efficiency for optimization of the above layout.

In the first step S1, a common width "Wb" is decided of the first, second and third cell regions 101, 102 and 103. For example, it is possible that the common width "Wb" is decided to be the same as a pitch or wider than the pitch by integer times.

In the second step S2, a driving capability "Wn" of the p-channel enhancement type MOS field effect transistor 2 of the buffer circuit 3 to decide the second length "Ln" of the second cell region 102 based upon the common width "Wb".

In the third step S3, a driving capability "Wn" of the p-channel enhancement type MOS field effect transistor 1 of the buffer circuit 3 to decide the first length "Lp" of the first cell region 101 based upon the common width "Wb".

In the fourth step S4, the transistor size "Wd", for example, the channel length and channel width, of the depletion type MOS field effect transistor 7 is decided to find the first length "Lp" of the third cell region 103 on which the depletion MOS field effect transistor 7 is provided, wherein initially the transistor size "Wd" is set to be smaller than a presumable size.

In the fifth step S5, by use of the known and available circuit simulator such as simulation program with integrated circuit emphasis (SPICE), an output voltage of the input/output pad 5 is set to be the same level as the high voltage as the power voltage so as to evaluate a current flowing from the input/output pad 5 under the condition of setting the voltage lower than the power voltage VDD by 0.4V for obtaining a driving current Ioh flowing through the input/output voltage. Subsequently, the driving current is subjected to a division by a total layout area of the first and second cell regions 101 and 102 to find a driving current efficiency "E" defined to be the driving current Ioh per a unit area of the buffer circuit 3 in accordance with the following equation.

$$E = Ioh / [\{(Lp+Ln)\} \times Wb]$$

In the sixth step S6, it is verified if the driving current efficiency "E" is the maximum. If the driving current efficiency "E" is not the maximum, then the process enters back to the fourth step S4 so that the transistor size "Wd" of the depletion MOS field effect transistor 7 is increased by a small increment for subsequent fining the third length of the third cell region 103 before entry into the fifth step S5 again. In this fifth step S5, a new driving current Ioh flowing through the input/output voltage is calculated by the circuit simulator in the above manner. Subsequently, the newly calculated driving current is subjected to the division by the total layout area to find a new driving current efficiency "E" defined to be the driving current Ioh per a unit area of the buffer circuit 3, so that it is verified if the driving current efficiency "E" is the maximum. The above loop processes will be repeated to obtain the driving current curve illustrative of variation in driving current "Ioh" over transistor size "Wd" of the depletion type MOS field effect transistor 7 in FIG. 6 so that the obtained driving capability curve provides informations about the optimum transistor size "WdMAX" for obtaining the maximum driving current. Once the maximum driving current efficiency "E" could be verified, then the process will enter into the following step.

In the seventh step S7, it is verified if the driving capability satisfies the requirement. If the driving capability is less than the required range, then the process will back to the second step S2 so that the driving capability "Wn" of the n-channel enhancement type MOS field effect transistor 2 is increased to find the second length "Ln" of the second cell region 102. Subsequently, the process will enter into the third step S3 so that the driving capability "Wp" of the channel enhancement type MOS field effect transistor 1 is also increased to find the first length "Lp" of the second cell region 101. The above fourth, fifth and sixth steps S4, S5 and S6 are again conducted until it could be verified that the driving capability satisfies the requirement. If, however, the driving capability is more than the required range, then the process will back to the second step S2 so that the driving capability "Wn" of the n-channel enhancement type MOS field effect transistor 2 is deceased to find the second length "Ln" of the second cell region 102. Subsequently, the process will enter into the third step S3 so that the driving capability "Wp" of the p-channel enhancement type MOS field effect transistor 1 is also decreased to find the first length "Lp" of the second cell region 101. The above fourth, fifth and sixth steps S4, S5 and S6 are again conducted until it could be verified that the driving capability satisfies the requirement.

If the driving capability satisfies the requirement, then the process will end in the eighth step S8.

Fourth Embodiment

A fourth embodiment according to the present invention will be described in detail. A difference of this third embodiment from the first embodiment is only in the circuit configuration of the interface circuit. With reference to FIG. 8, there is provided a novel semiconductor interface circuit between two semiconductor integrated circuits driven by different power voltage levels, wherein two depletion type MOS field effect transistors are provided for input and output sides respectively. The novel semiconductor interface circuit is connected between a first semiconductor integrated circuit driven by a first power voltage level and a second semiconductor integrated circuit driven by a second power voltage level which is higher than the first power voltage level illustrations of the first and second semiconductor integrated circuits are omitted. The novel semiconductor interface circuit comprises an output buffer circuit 3 which is represented by a rectangular shaped frame of broken lines and first and second depletion type MOS field effect transistors 7e and 7f which are represented by rectangular shaped frames of broken lines. The output buffer circuit 3 comprises a complementary MOS circuit having an input side connected to the first semiconductor integrated circuit and an output node 4 connected to the depletion type MOS field effect transistor 7. The first depletion type MOS field effect transistor 7e is connected in series between the output node 4 of the complementary MOS circuit and an input/output pad 5 of the second semiconductor integrated circuit. The depletion type MOS field effect transistor 7 is an n-channel type. The complementary MOS circuit comprises a series connection of a p-channel enhancement type MOS field effect transistor 1 and an n-channel enhancement type MOS field effect transistor 2 between a power voltage line 6 and a ground line. The p-channel enhancement type MOS field effect transistor 1 and the n-chancel enhancement type MOS field effect transistor 2 serve as first and second driver transistors. Gate electrodes of the p-channel enhancement type MOS field effect transistor 1 and the n-channel enhancement type MOS field effect transistor 2 are connected to the output side of the first semiconductor integrated circuit for receiving output signals from the first semiconductor integrated circuit A gate electrode of the depletion type MOS field effect transistor 7 is also connected to a control signal line 39. The second depletion type MOS field effect transistor 7f is connected in series between the input/output side 5 of the second semiconductor integrated circuit and an input side of an inventor gate 8 having an output side connected to the first semiconductor integrated circuit. A gate of the second depletion type MOS field effect transistor 7f is connected to the power voltage line 6. The second depletion type MOS field effect transistor 7f is an n-channel type.

It is essential for the present invention that the first depletion type MOS field effect transistor 7e is designed to have a driving capability which is substantially equal to or near a driving capability of the output buffer circuit 3. For example, a difference in driving capability between the first depletion type MOS field effect transistor 7e and the output buffer circuit 3 is within 10% of a range of variation in driving capability on manufacturing of the depletion type MOS field effect transistor and the output buffer circuit. What the diving capability of the first depletion type MOS field effect transistor 7e is substantially equal to or near the driving capability of the output buffer circuit 3 makes it possible to maximize a driving current efficiency defined to be a quotient obtained by dividing a driving current flowing through the input/output pad 5 by a total layout area of both the output buffer circuit 3 and the depletion type MOS field effect transistor 7 or by a layout area of the output buffer circuit 3. This maximization of the driving current efficiency of the semiconductor interface circuit allows an increase in degree of integration of the semiconductor interface circuit without keeping a sufficiently high driving capability thereof.

With reference again to FIG. 3, each of the first and second depletion type MOS field effect transistors 7e and 7f is formed in a p-type well region. A p-type semiconductor substrate 9 is grounded. A p-type well region 10 is formed on the p-type semiconductor substrate 9. An n-type source diffusion region 11-1 and an n-type drain diffusion region 11-2 are selectively formed in an upper region of the p-type well region 10. A p-type diffusion region 14 is selectively formed in the upper region of the p-type well region 10 for fixing a well potential of the p-type well region 10. A source electrode 12 is connected to the source diffusion region 11-1. A drain electrode 13 is connected to the drain diffusion region 11-2. A well potential fixing electrode 15 is connected to the p-type diffusion region 14.

The well potential fixing electrode 15 is also grounded to fix the potential of the p-type well region 10 at a lowest potential. A gate oxide film 16 is formed on the p-type well region 10. A channel region is defined between the source and drain diffusion regions 11-1 and 11-2 and positioned under the gate oxide film 16. A gate electrode 17 is formed on the gate oxide film 16. Side wall oxide films optionally formed on side walls of the gate electrode 17. An impurity concentration of the channel region is adjusted to have a threshold voltage be 0V or less.

With reference again to FIG. 9, the p-type enhancement MOS field effect transistor 1 of the complementary MOS circuit of the buffer circuit 3 is provided in a fist cell region 101 which corresponds to the n-type well region 19. The n-type enhancement MOS field effect transistor 2 of the complementary MOS circuit of the buffer circuit 3 is provided in a second cell region 102 which corresponds to the p-type well region 10. The depletion type MOS field effect transistor 7 is provided in a third cell region 103 which corresponds to the p-type well region 10. The first cell region 101 is rectangular-shaped to have a common width "Wb" and a first length "Lp". The second cell region 102 is rectangular-shaped to have the common width "Wb" and a second length "Ln". The third cell region 103 is rectangular-shaped to have the common width "Wb" and a third length "Ld". The first, second and third cell regions 101, 102 and 103 have the, same or common width "Wb". The fist, second and third cell regions 101, 102 and 103 are aligned in a length direction to form a cell unit 110 having the common width "Wb" and the total length of the first, second and third lengths "Lp", "Ln" and "Ld", so that the semiconductor interface circuit is provided on the rectangular-shaped cell unit 110.

In the first cell region 101, the p-type enhancement MOS field effect transistor 1 of the complementary MOS circuit of the buffer circuit 3 is divided into four parts so that there are provided four gate electrodes 1a, 1b, 1c and 1d, and three source regions 20a, 20b and 20c as well as two drain regions 23a and 23b. The three source regions 20a, 20b and 20c are connected through a first level aluminum interconnection 21 to a power terminal 22 through which a power voltage is supplied. The two drain regions 23a and 23b are connected to second level aluminum interconnections 24. The four gate electrodes 1a, 1b, 1c and 1d are connected through first and second level aluminum interconnections 25 and 26 to a gate electrode 27 of the p-type MOS field effect transistor.

In the second cell region 102, the n-type enhancement MOS field effect transistor 2 of the complementary MOS circuit of the buffer circuit 3 is divided into four parts so that there are provided four gate electrodes 2a, 2b, 2c and 2d, and three source regions 28a, 28b and 28c as well as two drain regions 31a and 31b. The three source regions 28a, 28b and 28c are connected through a first level aluminum interconnection 29 to a ground terminal 30 through which a ground voltage is supplied. The two drain regions 31a and 31b are connected to the second level aluminum interconnection 24. The four gate electrodes 2a, 2b, 2c and 2d are connected through first and second level aluminum interconnections 32 and 33 to a gate electrode 34 of the n-type MOS field effect transistor.

In the third cell region 103, the first depletion type MOS field effect transistor 7e is divided into three parts so that there are provided three gate electrodes 7e1, 7e2 and 7e3, and two source regions 35c and 35d as well as two drain regions 36d and 36e. The second depletion type MOS field effect transistor 7f comprises a single part which is provided with a single gate electrode 7f1, and a single source region 35e as well as the single drain region 36d. The two source regions 35c and 35d of the first depletion type MOS field effect transistor 7e are connected to the second level aluminum interconnection 24. The two drain regions 36d and 36e of the first depletion type MOS field effect transistor 7e are connected through second level aluminum interconnections 40 to the input/output pad 5. The three gate electrodes 7e1, 7e2 and 7e3 of the first depletion type MOS field effect transistor 7e are connected through a first level aluminum interconnection 41 and the second level interconnection 42 to the control signal line 39. The inventor gate 38 of the first depletion type MOS field effect transistor 7e is formed in the first semiconductor integrated circuit. Namely, the inventor gate 38 of the first depletion type MOS field effect transistor 7e is positioned out of the rectangular-shaped interface cell unit 110. The single source region 35c of the second depletion type MOS field effect transistor 7f is connected through a second level aluminum interconnection 43 to the output node 4 of the buffer circuit 3. The single drain region 36d of the second depletion type MOS field effect transistor 7f is common to the first depletion type MOS field effect transistor 7e and thus is connected through second level aluminum interconnection 40 to the input/output pad 5. The singe gate electrode 7f of the second depletion type MOS field effect transistor 7f is connected through a first level aluminum interconnection 44 to the power voltage line 22. The inventor gate 38 of the first depletion type MOS field effect transistor 7e is formed in the first semiconductor integrated circuit Namely, the inventor gate 38 of the first depiction type MOS field effect transistor 7e is positioned out of the rectangular-shaped interface cell unit 110.

As a result, a cell-base semiconductor integrated circuit is obtained which includes the interface cell unit 110.

As compared to the second embodiment, the number of the parts, into which the first depletion type MOS field effect transistor 7e as the output side transistor is divided, is less by one. Namely, in the second embodiment, the depletion type MOS field effect transistor 7 as the input/output side transistor is divided into the four parts, whilst in the second embodiment the first depletion type MOS field effect transistor 7e as the output side transistor is divided into the three parts, for which reason in order to keep the required driving capability, the third length "Ld" of the third cell region 103 of this embodiment is set longer by about 1.3 times than the third length "Ld" of the third cell region of the second embodiment.

In order to maximize the driving current efficiency, the above layout is optimized as follows by deciding the optimum first, second and third lengths and the common width of the first, second and third cell regions 101, 102 and 103. With reference again to FIG. 7, there will be described a method of deciding transistor sizes of the above depletion type MOS field effect transistor for optimizing the layout of the p-channel and n-chancel enhancement type MOS field effect transistors 1 and 2 of the buffer circuit 3 as well as the depletion type MOS field effect transistor 7 so as to maximize the driving current efficiency for optimization of the above layout.

In the first step S1, a common width "Wb" is decided of the first, second and third cell regions 101, 102 and 103. For example, it is possible that the common width "Wb" is decided to be the same as a pitch or wider than the pitch by integer times.

In the third step S2, a driving capability "Wn" of the p-channel enhancement type MOS field effect transistor 1 of the buffer circuit 3 to decide the first length "Lp" of the first cell region 101 based upon the common width "Wb".

In the second step S3, a driving capability "Wn" of the n-channel enhancement type MOS field effect transistor 2 of the buffer circuit 3 to decide the second length "Ln" of the second cell region 102 based upon the common width "Wb".

In the fourth step S4, the transistor size "Wd", for example, the channel length and channel width, of the depletion type MOS field effect transistor 7 is decided to find the first length "Lp" of the third cell region 103 on which the depletion MOS field effect transistor 7 is provided, wherein initially the transistor size "Wd" is set to be smaller than a presumable size.

In the fifth step S5, by use of the known and available circuit simulator such as simulation program with integrated circuit emphasis (SPICE), an output voltage of the input/output pad 5 is sot to be the same level as the high voltage as the power voltage so as to evaluate a current flowing from the input/output pad 5 under the condition of setting the voltage lower than the power voltage VDD by 0.4V for obtaining a driving current Ioh flowing through the input/output voltage. Subsequently, the driving current is subjected to a division by a total layout area of the first and second cell regions 101 and 102 to find a driving current efficiency "E" defined to be the driving current Ioh per a unit area of the buffer circuit 3 in accordance with the following equation.

$$E = Ioh/[\{(Lp+Ln)\} \times Wb]$$

In the sixth step S6, it is verified if the driving current efficiency "E" is the maximum. If the driving current efficiency "E" is not the maximum, then the process enters back to the fourth step S4 so that the transistor size "Wd" of the depletion MOS field effect transistor 7 is increased by a small increment for subsequent fining the third length of the third cell region 103 before entry into the fifth step S5 again. In this fifth step S5, a new driving current Ioh flowing through the input/output voltage is calculated by the circuit simulator in the above manner. Subsequently, the newly calculated driving current is subjected to the division by the total layout area to find a new driving current efficiency "E" defined to be the driving current Ioh per a unit area of the buffer circuit 3, so that it is verified if the driving current efficiency "E" is the maximum. The above loop processes will be repeated to obtain the driving current curve illustrative of variation in driving current "Ioh" over transistor size "Wd" of the depletion type MOS field effect transistor 7 in FIG. 6 so that the obtained driving capability curve provides informations about the optimum transistor size "WdMAX" for obtaining the maximum driving current. Once the maximum driving current efficiency "E" could be verified, then the process will enter into the following step.

In the seventh step S7, it is verified if the driving capability satisfies the requirement. If the driving capability is less than the required range, then the process will back to the second step S2 so that the driving capability "Wp" of the p-channel enhancement type MOS field effect transistor 1 is increased to find the first length "Lp" of the first cell region 101. Subsequently, the process will enter into the third step S3 so that the driving capability "Wn" of the n-channel enhancement type MOS field effect transistor 2 is also increased to find the second length "Ln" of the second cell region 101. The above fourth, fifth and sixth steps S4, S5 and S6 are again conducted until it could be verified that the driving capability satisfies the requirement. If, however, the driving capability is more than the required range, then the process will back to the second step S2 so that the driving capability "Wp" of the p-channel enhancement type MOS field effect transistor 2 is deceased to find the first length "Lp" of the first cell region 101. Subsequently, the process will enter into the third step S3 so that the driving capability "Wn" of the n-channel enhancement type MOS field effect transistor 2 is also decreased to find the second length "Lp" of the second cell region 101. The above fourth, fifth and sixth steps S4, S5 and S6 are again conducted until it could be verified that the driving capability satisfies the requirement.

If the driving capability satisfies the requirement, then the process will end in the eighth step S8.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor interface circuit connected between a first semiconductor device driven by a first level power voltage and a second semiconductor device driven by a second level power voltage which is higher than said first level power voltage, said semiconductor interface circuit comprising:
   an output buffer circuit being connected to said first semiconductor device; and
   at least a depletion type field effect transistor connected between said output buffer circuit and said second semiconductor device,
   wherein said at least depletion type field effect transistor has a driving capability substantially equal to or near a driving capability of said output buffer circuit;
   wherein said output buffer circuit is provided within a first rectangular region defined by a common width and a first length, and said at least depletion type field effect transistor is provided within a second rectangular region defined by said common width and a second length, and said first and second rectangular regions are aligned in a length direction to form a semiconductor interface circuit rectangular-shaped cell unit defined by a standardized size of said common width and a sum of said first and second lengths.

2. The semiconductor interface circuit as claimed in claim 1, wherein a difference in driving capability between said at least depletion type field effect transistor and said output buffer circuit is within 10% of a range of variation in driving capability on manufacturing of said at least depletion type field effect transistor and said output buffer circuit.

3. The semiconductor interface circuit as claimed in claim 1, wherein said at least depletion type field effect transistor has such a transistor size defined by a product of a channel length and a channel width thereof as to maximize a driving current efficiency defined to be a quotient obtained by dividing a driving current flowing between said at least depletion type field effect transistor and said second semiconductor device by a layout area of both said output buffer circuit and said at least depletion type field effect transistor.

4. The semiconductor interface circuit as claimed in claim 1, wherein said at least depletion type field effect transistor has a gate electrode applied with the same voltage level as applied to said output buffer circuit.

5. The semiconductor interface circuit as claimed in claim 1, wherein said output buffer circuit comprises at least a driver transistor, and said driving capability of said at least depletion type field effect transistor is substantially the same as a driving capability of said at least driver transistor in said output buffer circuit.

6. The semiconductor interface circuit as claimed in claim 5, wherein a difference in driving capability between said at least depletion type field effect transistor and said at least diver transistor in said output buffer circuit is within 10% of a range of variation in driving capability on manufacturing of said at least depletion type field effect transistor and said at least driver transistor.

7. The semiconductor interface circuit as claimed in claim 5, wherein said at least depletion type field effect transistor has such a transistor size defined by a product of a channel length and a channel width thereof as to maximize a quotient defined by dividing a driving current flowing between said at least depletion type field effect transistor and said second semiconductor device by a layout area of both said at least driver transistor and said at least depletion type field effect transistor.

8. The semiconductor interface circuit as claimed in claim 5, wherein said output buffer circuit comprises a complementary MOS circuit which further comprises a series connection of first and second enhancement type MOS field effect transistors of first and second conductivity types serving as driver transistors between a power voltage line and a ground line, and wherein said at least depletion type field effect transistor comprises a single depletion type field effect transistor connected in series between an output node of said complementary MOS circuit and an input/output pad of said second semiconductor device, and said single depletion type field effect transistor has a gate electrode connected to said power voltage line.

9. The semiconductor interface circuit as claimed in claim 8, wherein a first node between said output node of said CMOS circuit and said single depletion type field effect transistor is connected to an input side of an input inventor gate having an output connected to said first semiconductor device.

10. The semiconductor interface circuit as claimed in claim 5, wherein said output buffer circuit comprises a complementary MOS circuit which further comprises a series connection of first and second enhancement type MOS field effect transistors of first and second conductivity types serving as driver transistors between a power voltage line and a ground line, and wherein said at least depletion type field effect transistor comprises:
a first depletion type field effect transistor connected in series between an output node of said complementary MOS circuit and an input/output pad of said second semiconductor device; and
a second depletion type field effect transistor connected in series between said input/output pad of said second semiconductor device and an input side of an input inventor gate having an output connected to said first semiconductor device, and said second depletion type field effect transistor has a gate electrode connected to said power voltage line.

11. A semiconductor interface circuit connected between a first semiconductor device driven by a first level sower voltage and a second semiconductor device driven by a second level power voltage which is higher than said first level power voltage, said semiconductor interface circuit comprising:
an output buffer circuit being connected to said first semiconductor device; and
at least a depletion type field effect transistor connected between said output buffer circuit and said second semiconductor device,
wherein said at least depletion type field effect transistor has a driving capability substantially equal to or near a driving capability of said output buffer circuit;
wherein said output buffer circuit comprises a complementary MOS circuit which further comprises a series connection of first and second enhancement type MOS field effect transistors of first and second conductivity types serving as driver transistors between a power voltage line and a ground line, wherein said at least depletion type field effect transistor comprises a single depletion type field effect transistor connected in series between an output node of said complementary MOS circuit and an input/output pad of said second semiconductor device, and said single depletion type field effect transistor has a gate electrode connected to said power voltage line, wherein said first enhancement type MOS field effect transistor is provided within a first rectangular region defined by a common width and a first length, wherein said second enhancement type MOS field effect transistor is provided within a second rectangular region defined by a common width and a second length, and wherein said single depletion type field effect transistor is provided within a third rectangular region defined by said common width and a third length, so that said first, second and third rectangular region are aligned in a length direction to form a semiconductor interface circuit rectangular-shaped cell unit defined by a standardized size of said common width and a sum of said first, second and third lengths.

12. A semiconductor interface circuit connected between a first semiconductor device driven by a first level Power voltage and a second semiconductor device driven by a second level power voltage which is higher than said first level power voltage, said semiconductor interface circuit comprising:
an output buffer circuit being connected to said first semiconductor device; and
at least a depletion type field effect transistor connected between said output buffer circuit and said second semiconductor device,
wherein said at least depletion type field effect transistor has a driving capability substantially equal to or near a driving capability of said output buffer circuit;
wherein said output buffer circuit comprises a complementary MOS circuit which further comprises a series connection of first and second enhancement type MOS field effect transistors of first and second conductivity types serving as driver transistors between a power voltage line and a ground line, and
wherein said at least depletion type field effect transistor comprises:
a first depletion type field effect transistor connected in series between an output node of said complementary MOS circuit and an input/output pad of said second semiconductor device; and
a second depletion type field effect transistor connected in series between said input/output pad of said second semiconductor device and an input side of an input inventor gate having an output connected to said first semiconductor device, and said second depletion type field effect transistor has a gate electrode connected to said power voltage line, and
wherein said first enhancement type MOS field effect transistor is provided within a first rectangular region defined by a common width and a first length,
wherein said second enhancement type MOS field effect transistor is provided within a second rectangular region defined by a common width and a second length, and wherein said first and second depletion type field effect transistors are provided within a third rectangular region defined by said common width and a third length, so that said first, second and third rectangular region are aligned in a length direction to form a semiconductor interface circuit rectangular-shaped cell unit defined by a standardized size of said common width and a sum of said first, second and third lengths.

13. The semiconductor interface circuit as claimed in claim 1, wherein said first and second semiconductor devices comprise first and second semiconductor integrated circuits.

14. A semiconductor interface circuit connected between a first semiconductor integrated circuit driven by a first level power voltage and a second semiconductor integrated circuit driven by a second level power voltage which is higher than said first level power voltage, said semiconductor interface circuit comprising:

an output buffer circuit having an input side being connected to said first semiconductor integrated circuit; and at least a depletion type field effect transistor connected between an output side of said output buffer circuit and an input/output terminal of said second semiconductor integrated circuit, wherein said at least depletion type field effect transistor has such a transistor size defined by a product of a channel length and a channel width thereof as to provide said at lest depletion type field effect transistor with a driving capability substantially equal to or near a driving capability of said output buffer circuit;

wherein said output buffer circuit is provided within a first rectangular region defined by a common width and a first length, and said at least depletion type field effect transistor is provided within a second rectangular region defined by said common width and a second length, and said first and second rectangular regions are aligned in a length direction to form a semiconductor interface circuit rectangular-shaped cell unit defined by a standardized size of said common width and a sum of said first and second lengths.

15. The semiconductor interface circuit as claimed in claim 14, wherein a difference in driving capability between said at least depletion type field effect transistor and said output buffer circuit is within 10% of a range of variation in driving capability on manufacturing of said at least depletion type field effect transistor and said output buffer circuit.

16. The semiconductor interface circuit as claimed in claim 14, wherein said transistor size of said at least depletion type field effect transistor is decided to maximize a driving current efficiency defined to be a quotient obtained by dividing a driving current flowing between said at least depletion type field effect transistor and said second semiconductor integrated circuit by a layout area of both said output buffer circuit and said at least depletion type field effect transistor.

17. The semiconductor interface circuit as claimed in claim 16, wherein said at least depletion type field effect transistor has a gate electrode applied with the same voltage level as applied to said output buffer circuit.

18. The semiconductor interface circuit as claimed in claim 17, wherein said output buffer circuit comprises at least a driver transistor, and said driving capability of said at least depletion type field effect transistor is substantially the same as a driving capability of said at least driver transistor in said output buffer circuit.

19. The semiconductor interface circuit as claimed in claim 18, wherein a difference in driving capability between said at least depletion type field effect transistor and said at least driver transistor in said output buffer circuit is within 10% of a range of variation in driving capability on manufacturing of said at least depletion type field effect transistor and said at least driver transistor.

20. The semiconductor interface circuit as claimed in claim 18, wherein said transistor size of said at least depletion type field effect transistor is decided to maximize a quotient defined by dividing a driving current flowing between said at least depletion type field effect transistor and said second semiconductor integrated circuit by a layout area of both said at least driver transistor and said at least depletion type field effect transistor.

21. The semiconductor interface circuit as clued in claim 18, wherein said output buffer circuit comprises a complementary MOS circuit which further comprises a series connection of first and second enhancement type MOS field effect transistors of first and second conductivity types serving as driver transistors between a power voltage line and a ground line, and wherein said at least depletion type field effect transistor comprises a single depletion type field effect transistor connected in series between an output node of said complementary MOS circuit and an input/output pad of said second semiconductor integrated circuit, and said single depletion type field effect transistor has a gate electrode connected to said power voltage line.

22. The semiconductor interface circuit as claimed in claim 21, wherein a first node between said output node of said CMOS circuit and said single depletion type field effect transistor is connected to an input side of an input inventor gate having an output connected to said first semiconductor integrated circuit.

23. The semiconductor interface circuit as claimed in claim 18, wherein said output buffer circuit comprises a complementary MOS circuit which further comprises a series connection of first and second enhancement type MOS field effect transistors of first and second conductivity types serving as driver transistors between a power voltage line and a ground line, and wherein said at least depletion type field effect transistor comprises:

a first depletion type field effect transistor connected in series between an output node of said complementary MOS circuit and an input/output pad of said second semiconductor integrated circuit; and a second depletion type field effect transistor connected in series between said input/output pad of said second semiconductor integrated circuit and an input side of an input inventor gate having an output connected to said first semiconductor integrated circuit, and said second depletion type field effect transistor has a gate electrode connected to said power voltage line.

24. A semiconductor interface circuit connected between a first semiconductor integrated circuit driven by a first level power voltage and a second semiconductor integrated circuit driven by a second level power voltage which is higher than said first level power voltage, said semiconductor interface circuit comprising:

an output buffer circuit having an input side being connected to said first semiconductor integrated circuit; and at least a depletion type field effect transistor connected between an output side of said output buffer circuit and an input/output terminal of said second semiconductor integrated circuit, wherein said at least depletion type field effect transistor has such a transistor size defined by a product of a channel length and a channel width thereof as to provide said at lest depletion type field effect transistor with a driving capability substantially equal to or near a driving capability of said output buffer circuit;

wherein said output buffer circuit comprises a complementary MOS circuit which further comprises a series connection of first and second enhancement type MOS field effect transistors of first and second conductivity types serving as driver transistors between a power voltage line and a ground line, wherein said at least depletion type field effect transistor comprises a single depletion type field effect transistor connected in series between an output node of said complementary MOS circuit and an input/output pad of said second semiconductor integrated circuit, and said single depletion type field effect transistor has a gate electrode connected to said power voltage line, wherein said first enhancement type MOS field effect transistor is provided within a first rectangular region defined by a common width and a first length, wherein said second enhancement type MOS field effect transistor is provided within a second rectangular region defined by a common width and a second length, and wherein said single depletion type field effect transistor is provided within a third rectangular region defined by said common width and a third length, so that said first, second and third rectangular region are aligned in a length direction to form a semiconductor interface circuit rectangular-shaped cell unit defined by a standardized size of said common width and a sum of said first, second and third lengths.

25. A semiconductor interface circuit connected between a first semiconductor integrated circuit driven by a first level power voltage and a second semiconductor integrated circuit driven by a second level Power voltage which is higher than said first level sower voltage, said semiconductor interface circuit comprising:

an output buffer circuit having an input side being connected to said first semiconductor integrated circuit; and at least a depletion type field effect transistor connected between an output side of said output buffer circuit and an input/output terminal of said second semiconductor integrated circuit, wherein said at least depletion type field effect transistor has such a transistor size defined by a product of a channel length and a channel width thereof as to provide said at lest depletion type field effect transistor with a driving capability substantially equal to or near a driving capability of said output buffer circuit;

wherein said output buffer circuit comprises a complementary MOS circuit which further comprises a series connection of first and second enhancement type MOS field effect transistors of first and second conductivity types serving as driver transistors between a power voltage line and a ground line, and wherein said at least depletion type field effect transistor comprises:

a first depletion type field effect transistor connected in series between an output node of said complementary MOS circuit and an input/output pad of said second semiconductor integrated circuit; and a second depletion type field effect transistor connected in series between said input/output pad of said second semiconductor integrated circuit and an input side of an input inventor gate having an output connected to said first semiconductor integrated circuit, and said second depletion type field effect transistor has a gate electrode connected to said power voltage line, and wherein said first enhancement type MOS field effect transistor is provided within a first rectangular region defined by a common width and a first length, wherein said second enhancement type MOS field effect transistor is provided within a second rectangular region defined by a common width and a second length, and wherein said first and second depletion type field effect transistors are provided within a third rectangular region defined by said common width and a third length, so that said first, second and third rectangular region are aligned in a length direction to form a semiconductor interface circuit rectangular-shaped cell unit defined by a standardized size of said common width and a sum of said first, second and third lengths.

26. A semiconductor interface circuit connected between a first semiconductor integrated circuit driven by a first level power voltage and a second semiconductor integrated circuit driven by a second level sower voltage which is higher than said first level power voltage, said semiconductor interface circuit comprising:

an output buffer circuit comprising a complementary MOS circuit which further comprises a series connection of first and second enhancement type MOS field effect transistors of first and second conductivity types serving as driver transistors, said complementary MOS circuit being connected between a power voltage line and a ground line, and said complementary MOS circuit having an input side being connected to said first semiconductor integrated circuit and an output terminal; and a single depletion type field effect transistor connected in series between an output node of said complementary MOS circuit and an input/output pad of said second semiconductor integrated circuit, and said single depletion type field effect transistor has a gate electrode connected to said power voltage line, wherein said single depletion type field effect transistor has such a transistor size defined by a product of a channel length and a channel width thereof as to provide said single depletion type field effect transistor with substantially the same driving capability as said complementary MOS circuit, and wherein said transistor size of said single depletion type field effect transistor and transistor sizes of said first and second enhancement type MOS field effect transistors in said output buffer circuit are decided to maximize a driving current efficiency defined to be a quotient obtained by dividing a driving current flowing through said input/output pad by a layout area of both said output buffer circuit and said single depletion type field effect transistor;

wherein said first enhancement type MOS field effect transistor is provided within a first rectangular region defined by a common width and a first length, wherein said second enhancement type MOS field effect transistor is provided within a second rectangular region defined by a common width and a second length, and wherein said single depletion type field effect transistor is provided within a third rectangular region defined by said common width and a third length, so that said first, second and third rectangular region are aligned in a length direction to form a semiconductor interface circuit rectangular-shaped cell unit defined by a standardized size of said common width and a sum of said first, second and third lengths.

27. The semiconductor interface circuit as claimed in claim 26, wherein a difference in driving capability between said single depletion type field effect transistor and said output buffer circuit is within 10% of a range of variation in driving capability on manufacturing of said single depletion type field effect transistor and said output buffer circuit.

28. A semiconductor interface circuit connected between a first semiconductor integrated circuit driven by a first level power voltage and a second semiconductor integrated circuit driven by a second level power voltage which is higher than said first level power voltage, said semiconductor interface circuit comprising:

an output buffer circuit comprising a complementary MOS circuit which further comprises a series connection of first and second enhancement type MOS field effect transistors of first and second conductivity types serving as driver transistors, said complementary MOS circuit being connected between a power voltage line and a ground line, and said complementary MOS circuit having an input side being connected to said first semiconductor integrated circuit and an output terminal;

a first depletion type field effect transistor in series between an output node of said complementary MOS circuit and an input/output Pad of said second semiconductor integrated circuit; and a second depletion type field effect transistor connected in series between said input/output sad of said second semiconductor integrated circuit and an input side of an input inventor gate having an output connected to said first semiconductor integrated circuit, and said second depletion type field effect transistor has a gate electrode connected to said power voltage line, wherein said first and second depletion type field effect transistors have first and second transistor sizes, each of which is defined by a product of a channel length and a channel width thereof so that said first and second transistor sizes are so decided as to Provide said first and second depletion type field effect transistors with substantially the same driving capability as said complementary MOS circuit, and wherein said first and second transistor size of said first and second depletion type field effect transistors and transistor sizes of said first and second enhancement type MOS field effect transistors in said output buffer circuit are decided to maximize a driving current efficiency defined to be a quotient obtained by dividing a driving current flowing through said input/output pad by a layout area of both said output buffer circuit and said first and second depletion type field effect transistors;

wherein said first enhancement type MOS field effect transistor is provided within a first rectangular region defined by a common width and a first length, wherein said second enhancement type MOS field effect transistor is provided within a second rectangular region defined by a common width and a second length, and wherein said first and second depletion type field effect transistors are provided within a third rectangular region defined by said common width and a third length, so that said first, second and third rectangular region are aligned in a length direction to form a semiconductor interface circuit rectangular-shaped cell unit defined by a standardized size of said common width and a sum of said first, second and third lengths.

29. The semiconductor interface circuit as claimed in claim 28, wherein a difference in driving capability between said first and second depletion type field effect transistors and said output buffer circuit is within 10% of a range of variation in driving capability on manufacturing of said first and second depletion type field effect transistors and said output buffer circuit.

* * * * *